United States Patent [19]
Yamaguchi et al.

[11] Patent Number: 5,837,606
[45] Date of Patent: Nov. 17, 1998

[54] SEMICONDUCTOR DEVICE HAVING INTERNAL WIRE AND METHOD OF FABRICATING THE SAME

[75] Inventors: Takehisa Yamaguchi; Hidekazu Oda, both of Hyogo, Japan

[73] Assignee: Mitsubishi Denki Kabushiki Kaisha, Tokyo, Japan

[21] Appl. No.: 668,012

[22] Filed: Jun. 17, 1996

Related U.S. Application Data

[62] Division of Ser. No. 339,662, Nov. 14, 1994, Pat. No. 5,550,409.

[30] Foreign Application Priority Data

Jun. 29, 1994 [JP] Japan ................................. 6-148240

[51] Int. Cl.⁶ ........................................... H01L 21/4763
[52] U.S. Cl. ............................................................ 138/649
[58] Field of Search ........................... 437/200; 438/64 A

[56] References Cited

U.S. PATENT DOCUMENTS 4,782,037  11/1988  Tomozawa et al. ..................... 437/192
4,884,123  11/1989  Dixit et al. ................................. 357/71

*Primary Examiner*—Charles L. Bowers, Jr.
*Assistant Examiner*—Reneé R. Berry
*Attorney, Agent, or Firm*—Lowe, Price, LeBlanc & Becker

[57] ABSTRACT

In order to obtain a semiconductor device having an internal wire of low resistance, a conductive layer whose surface is silicified is provided in a surface of a semiconductor substrate. A conductor whose surface is silicified is provided on the semiconductor substrate in proximity to the conductive layer. This semiconductor device is provided with an internal wiring layer, which is formed by a titanium film and a titanium silicide layer for electrically connecting the surface of the conductive layer and a surface of an end of the conductor with each other, to cover a side wall surface and a bottom surface of a contact hole.

3 Claims, 33 Drawing Sheets

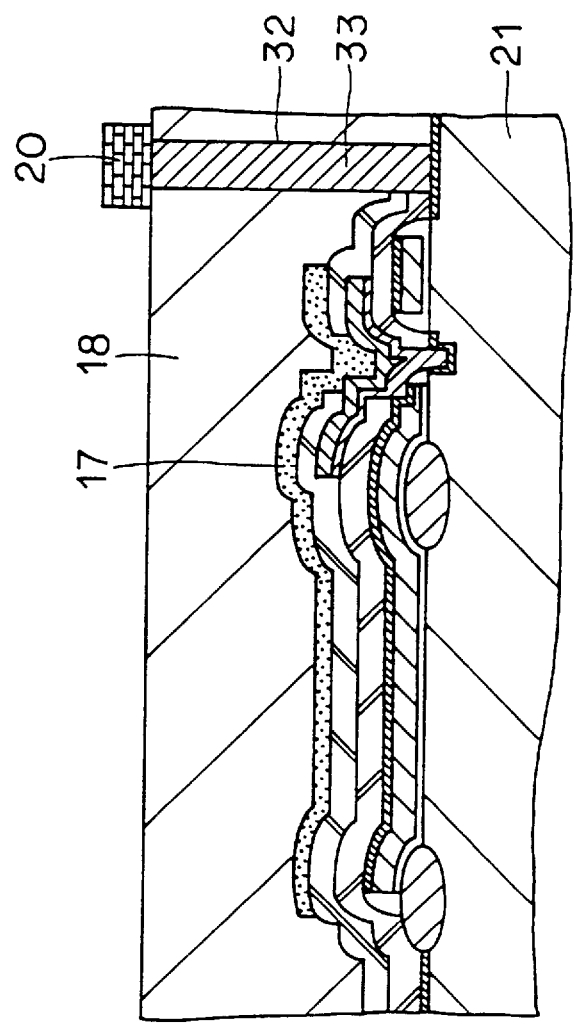
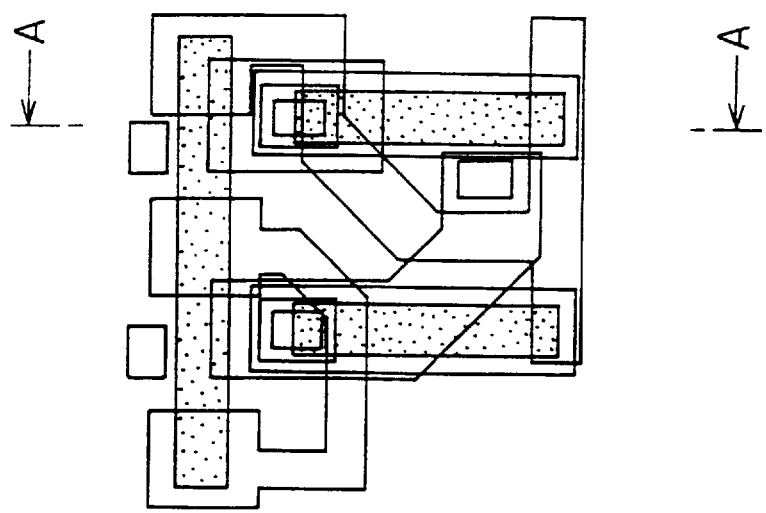
FIG. 19A
FIG. 19B

SEMICONDUCTOR DEVICE HAVING INTERNAL WIRE AND METHOD OF FABRICATING THE SAME

This application is a division of application Ser. No. 08/339,662 filed Nov. 14, 1994 U.S. Pat. No. 5,550,469.

BACKGROUND OF THE INVENTION

1. Field of the Invention

The present invention generally relates to a semiconductor device having an internal wire, and more specifically, it relates to a semiconductor device having an internal wire which is connected to a conductive layer whose surface is silicified. The present invention also relates to a method of fabricating a semiconductor device having such an internal wire.

2. Description of the Background Art

A semiconductor device such as a static random access memory (SRAM) or a dynamic random access memory (DRAM) is recently implemented with higher density of integration, followed by reduction of elements as formed. In a semiconductor device which is formed by a transistor of a MOS structure, reduction of a source/drain region is required following refinement of a gate electrode, leading to requirement for reduction in diameter of a contact hole for forming a wire etc. However, such reduction of the source/drain region and the diameter of the contact hole causes increase in resistance of the source/drain, gate resistance and contact resistance of the transistor, leading to deterioration in characteristics of the semiconductor device. In order to solve this problem, proposed is a salicide (self aligned silicide) process of forming layers of a silicide, which is a compound of a metal and silicon, on the source/drain and the gate electrode in a self-aligned manner.

It is conceivably possible to solve the problem following reduction of the elements through the salicide process. When this process is applied to a large scale integrated circuit such as an SRAM or a DRAM, however, a new problem is caused as follows:

In construction of such a large scale integrated circuit, it is necessary to connect elements forming the SRAM or the DRAM.

FIG. 28 is a plan view showing a memory cell (hereinafter referred to as a static memory cell) of an SRAM, and FIG. 29 is an equivalent circuit diagram of the static memory cell. Referring to these figures, the static memory cell comprises access transistors ATR1 and ATR2, and driver transistors DTR1 and DTR2. The static memory cell forms a flip-flop, and the driver transistor DTR1 has a drain which is connected with a gate of the access transistor ATR2 by an internal wire. In general, this internal wire is prepared from a heat resistant material such as polysilicon, to be capable of withstanding heat treatment which is carried out in a later step at a high temperature of up to 900° C.

Steps of fabricating the memory cell of the conventional SRAM are now described, to explain a problem which is caused when polysilicon is employed as the material for the wire and the transistors are formed through a salicide process.

FIG. 30A is a sectional view taken along the line A—A in FIG. 30B, which is a plan view. Referring to FIGS. 30A and 30B, LOCOS films 4 are formed on a major surface of a silicon substrate 21. Gates 2 and 3 of the access transistor ATR2 and the driver transistor DTR1 are formed on the silicon substrate 21 respectively, to be adjacent to each other. Further, a source/drain region 6 and side wall spacers 5 are formed.

Referring to FIG. 31, a titanium film 7 is formed on the silicon substrate 21 by sputtering, to cover the gates 2 and 3 while being in contact with the source/drain region 6.

Referring to FIGS. 31, 32A and 32B, heat treatment is carried out through a lamp annealer at a temperature of about 700° C. in a nitrogen atmosphere, to react titanium with silicon. At this time, instable titanium silicide films ($TiSi_x$) 8 are formed on the gates 2 and 3. On the other hand, the titanium film 7 provided on the side wall spacers 5 and the LOCOS films 4 is reacted not with the oxide films but with nitrogen contained in the atmosphere, to form a titanium nitride film 9.

Referring to FIGS. 32A, 32B and 33, the titanium nitride film 9 and unreacted titanium are removed by a solution consisting of sulfuric acid and hydrogen peroxide.

Referring to FIG. 33, the instable titanium silicide films 8 are made of an instable titanium silicide of high resistance, a compound of titanium and silicon expressed as $TiSi_x$, which is not converted to $TiSi_2$ of low resistance.

Referring to FIGS. 33 and 34, heat treatment is carried out through a lamp annealer at a temperature of about 800° C., in order to convert the compound $TiSi_x$ to $TiSi_2$ of low resistance. Thus, the instable titanium silicide films 8 are converted to stable titanium silicide films 10 of low resistance. Thus, silicified transistors are formed.

The structure of an internal wire is now described. Referring to FIGS. 35A and 35B, an interlayer insulating film 11 is formed on the silicified transistors. A contact hole 12 is formed in the interlayer insulating film 11 by reactive ion etching, for exposing surfaces of the source/drain region 6 and an end of the gate 3 of the driver transistor DTR1. At this time, the titanium silicide films 10 which are formed on the surfaces of the gate 3 and the source/drain region 6 are not etched due to selectivity against gas which is employed for etching the oxide film.

Referring to FIG. 36, a polysilicon film 13 is formed on the silicon substrate 21 by CVD, to be embedded in the contact hole 12. This polysilicon film 13 is adapted to form an internal wiring layer, as described later. In the conventional method, a problem is caused in formation of the polysilicon film 13, as hereafter described.

Referring to FIG. 42, silane ($SiH_4$) gas is employed as source gas for forming a polysilicon film. The silane gas is decomposed by heat to form nuclei on a depositional surface, so that a film is thereafter grown from the nuclei. This growth strongly depends on the state of the depositional surface. This state is well known in relation to silicon, but not well known in relation to a depositional surface of a metal. The inventors have confirmed that the following abnormality is caused when a polysilicon film is formed on the titanium silicide films 10 by CVD:

In the titanium silicide layers 10, impurity diffusion coefficients are so large that silicon radicals (Si*) formed by decomposition of the silane gas are readily diffused in the titanium silicide layers 10, to reach interfaces between the titanium silicide layers 10 and silicon (1). Referring to FIG. 43, polysilicon is thereafter grown on the interfaces between the titanium silicide layers 10 and the silicon (1) to push up the upper titanium silicide layers 10, and to finally break the same. When this phenomenon is caused in the internal wire of the memory cell of the SRAM, this leads to increase in contact resistance.

Referring to FIGS. 36, 37A and 37B, the polysilicon film 13 is patterned to form an internal wiring layer 14. An impurity is implanted into the internal wiring layer 14, to reduce its resistance.

Referring to FIG. 38, an interlayer insulating film 15, which is an oxide film, is formed on the silicon substrate 21, to cover the internal wiring layer 14.

Referring to FIGS. 39A and 39B, a contact hole 16 is formed in the interlayer insulating film 15, for partially exposing the surface of the internal wiring layer 14.

Referring to FIGS. 39A, 39B, 40A and 40B, a polysilicon film 17 is deposited on the silicon substrate 21, to be embedded in the contact hole 16. This polysilicon film 17 is patterned in the form of a resistor, which corresponds to a resistor 17 in the equivalent circuit shown in FIG. 29.

Referring to FIGS. 41A and 41B, a thick interlayer insulating film 18 is deposited on the silicon substrate 21, to cover the polysilicon film 17. A contact hole 19 is formed in this interlayer insulating film 18, and a tungsten plug 33 is embedded in this contact hole 19. An aluminum wire 20 is formed to be connected to the tungsten plug 33, thereby completing the memory cell of the SRAM.

In the aforementioned conventional method of fabricating an internal wire, polysilicon is abnormally grown as shown in FIGS. 42 and 43, to increase the contact resistance. Further, the wire itself is increased in resistance due to reduction in width of the internal wire, to remarkably deteriorate characteristics of the semiconductor device.

SUMMARY OF THE INVENTION

Accordingly, an object of the present invention is to obtain a semiconductor device having an internal wire of low resistance.

Another object of the present invention is to obtain a semiconductor device having an internal wire of low contact resistance.

Still another object of the present invention is to obtain a static random access memory having an internal wire of low resistance.

A further object of the present invention is to obtain a static random access memory having an internal wire of low contact resistance.

A further object of the present invention is to provide a method of fabricating a semiconductor device having an internal wire of low resistance.

A further object of the present invention is to provide a method of fabricating a semiconductor device having an internal wire of low contact resistance.

A further object of the present invention is to provide a method of fabricating a static random access memory having an internal wire of low resistance.

A semiconductor device according to a first aspect of the present invention comprises a semiconductor substrate. A conductive layer whose surface is silicified is provided in a surface of the semiconductor substrate. A conductor whose surface is silicified is provided on the semiconductor substrate in proximity to the conductive layer. An interlayer insulating film is provided on the semiconductor substrate, to cover the conductor. A contact hole is provided in the interlayer insulating film, for exposing both surfaces of the conductive layer and an end of the conductor. An internal wiring layer for electrically connecting the surfaces of the conductive layer and the end of the conductor with each other is provided to cover a side wall surface and a bottom surface of the contact hole. The internal wiring layer includes a titanium film which is directly in contact with the side wall surface and the bottom surface of the contact hole, and a first silicide layer which is provided on this titanium film.

A semiconductor device according to a second aspect of the present invention comprises a semiconductor substrate. Gates of a driver transistor and an access transistor are provided on the semiconductor substrate, to be adjacent to each other. A source/drain layer of the access transistor is provided in a major surface of the semiconductor substrate between the gates of the driver transistor and the access transistor. A first silicide layer is provided on a surface of the source/drain layer. An interlayer insulating film is provided on the semiconductor substrate, to cover the gates of the driver transistor and the access transistor. A contact hole is provided in the interlayer insulating film, for exposing both surfaces of the source/drain layer of the access transistor and an end of the gate of the driver transistor. An internal wiring layer for electrically connecting the surfaces of the end of the gate of the driver transistor and the source/drain layer of the access transistor with each other is provided to cover a side wall surface and a bottom surface of the contact hole. The internal wiring layer includes a titanium film which is directly in contact with the side wall surface and the bottom surface of the contact hole, and a second silicide layer which is provided on this titanium film.

In a method of fabricating a semiconductor device according to a third aspect of the present invention, a conductive layer is first formed in a surface of a semiconductor substrate. A conductor is formed on the semiconductor substrate, in proximity to the conductive layer. Surfaces of the conductive layer and the conductor are silicified. An interlayer insulating film is formed on the semiconductor substrate, to cover the conductor. A contact hole is formed in the interlayer insulating film, for simultaneously exposing surfaces of the conductive layer and an end of the conductor. A titanium film for covering a side wall surface and a bottom surface of the contact hole is formed by sputtering, to be in contact with the surfaces of the conductive layer and the end of the conductor. A silicide film is formed on the titanium film by sputtering. The titanium film and the silicide film are patterned in the form of an internal wire.

In the semiconductor device according to the first aspect of the present invention, the internal wiring layer is formed by the titanium layer and the silicide layer which is provided on the titanium layer, whereby the semiconductor device has an internal wire of low resistance.

In the semiconductor device according to the second aspect of the present invention, the internal wiring layer is formed by the titanium layer and the silicide layer which is provided on the titanium layer, whereby a static random access memory having an internal wire of low resistance is obtained.

In the method of fabricating a semiconductor device according to the third aspect of the present invention, the internal wiring layer is formed by the titanium layer and the silicide layer which is provided on the titanium layer, whereby a semiconductor device having an internal wire of low resistance is provided. Further, the internal wiring layer is formed by sputtering, whereby the silicide layer which is formed on the conductive layer is not broken.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIGS. 19A and 19B are sectional views and plan views showing the semiconductor device in a fifth step of the method of fabricating the semiconductor device according to the embodiment 2 of the present invention respectively;

DESCRIPTION OF THE PREFERRED EMBODIMENTS

Embodiments of the present invention are now described with reference to the drawings.

Embodiment 1

Figure 1:
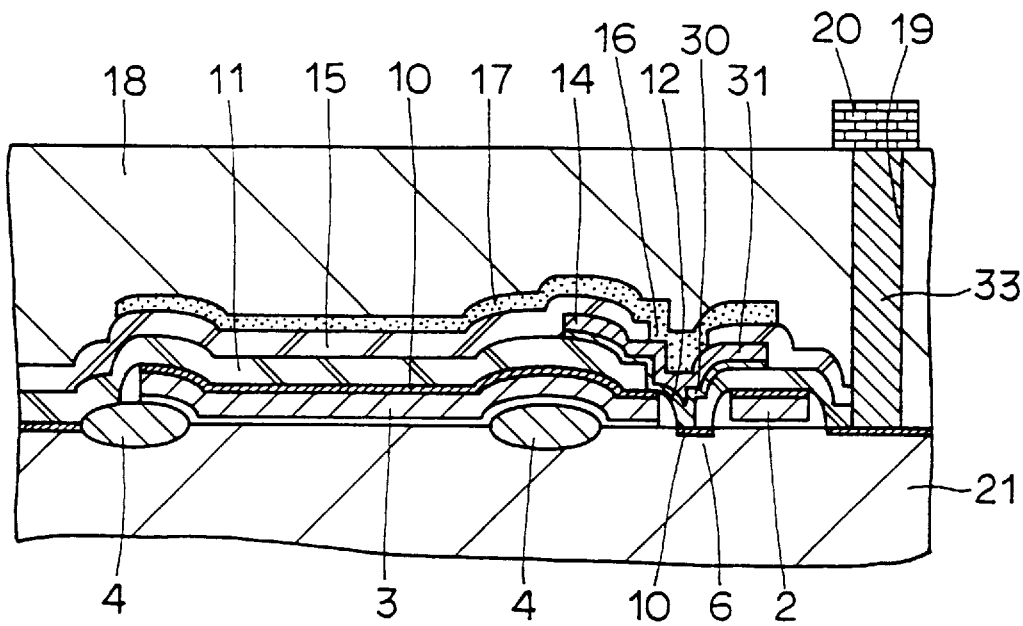
FIG. 1 is a sectional view showing a memory cell of an SRAM according to an embodiment 1 of the present invention.
Figure 3:
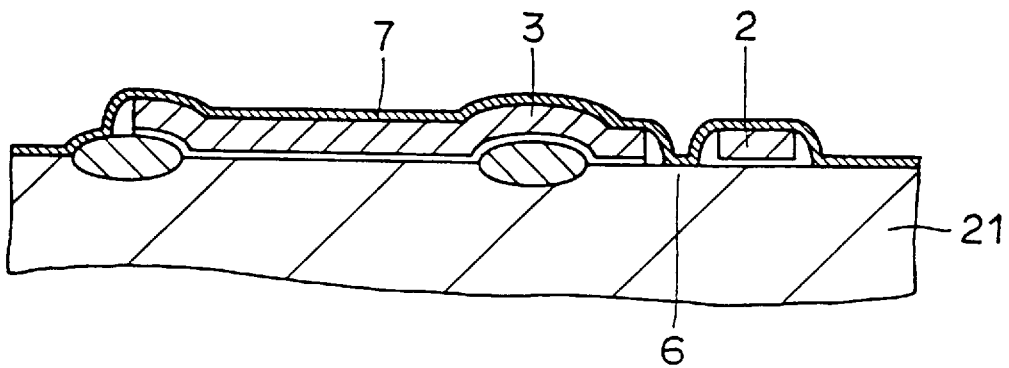
FIG. 3 is a sectional view showing the semiconductor device in a second step of the method of fabricating the semiconductor device according to the embodiment 1 of the present invention.
Figure 2B:
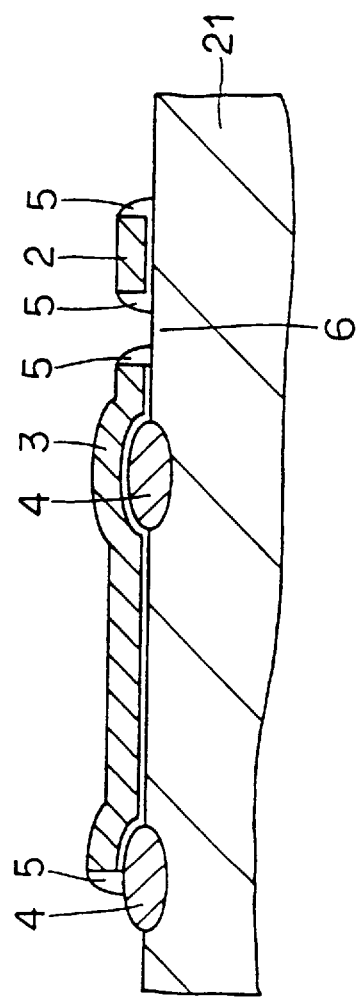
FIGS. 2A and 2B are sectional views and plan views showing a semiconductor device in a first step of a method of fabricating the semiconductor device according to the embodiment 1 of respectively.
Figure 2A:
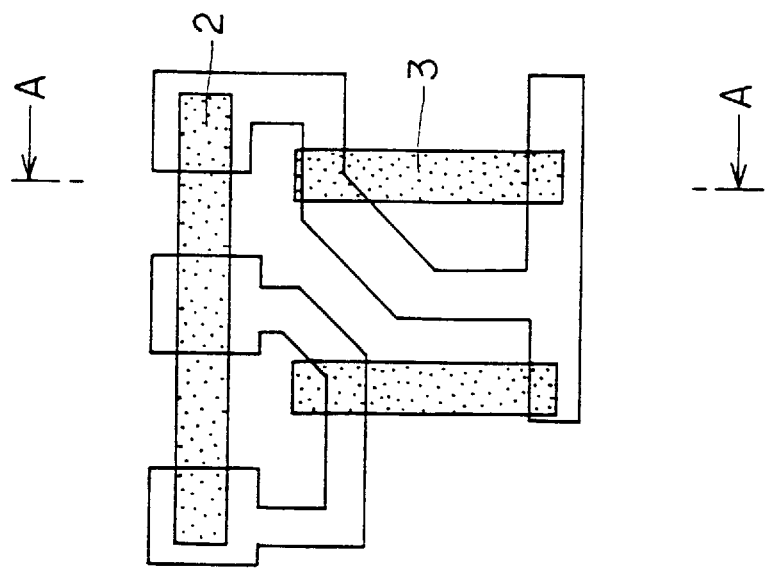
Figure 4B:
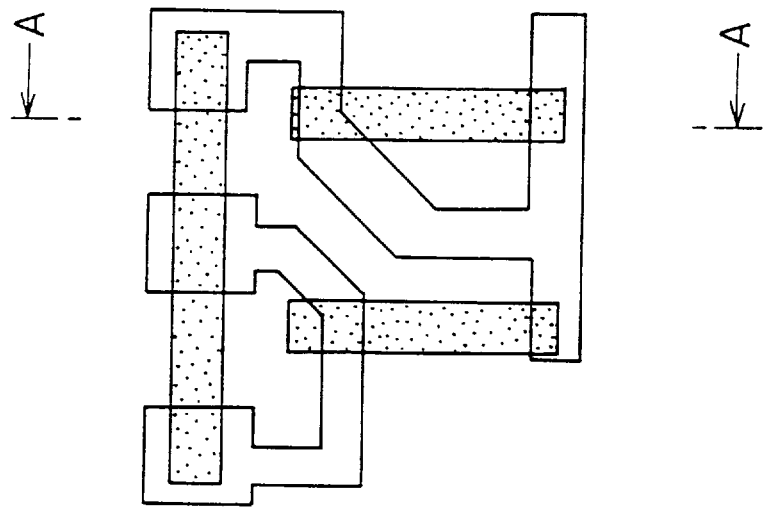
FIGS. 4A and 4B are sectional views and plan views showing the semiconductor device in a third step of the method of fabricating the semiconductor device according to the embodiment 1 of the present invention respectively.
Figure 4A:
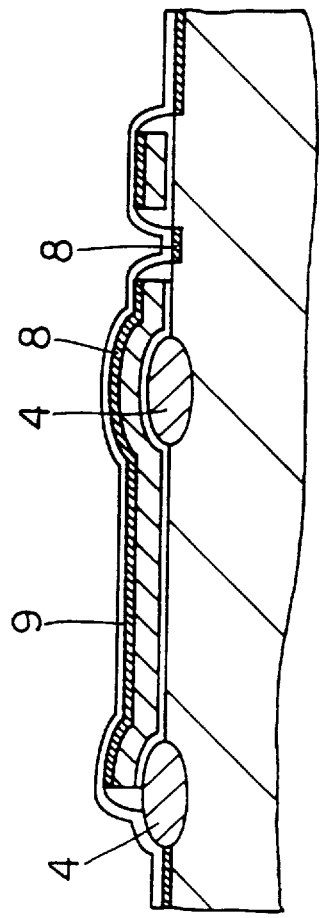
Figure 5:
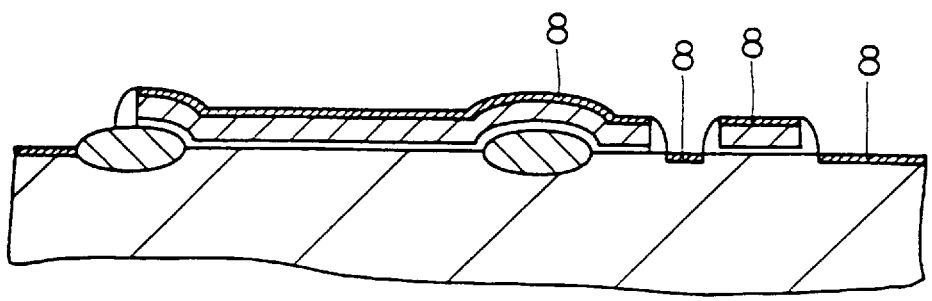
FIG. 5 is a sectional view showing the semiconductor device in a fourth step of the method of fabricating the semiconductor device according to the embodiment 1 of the present invention.
Figure 6:
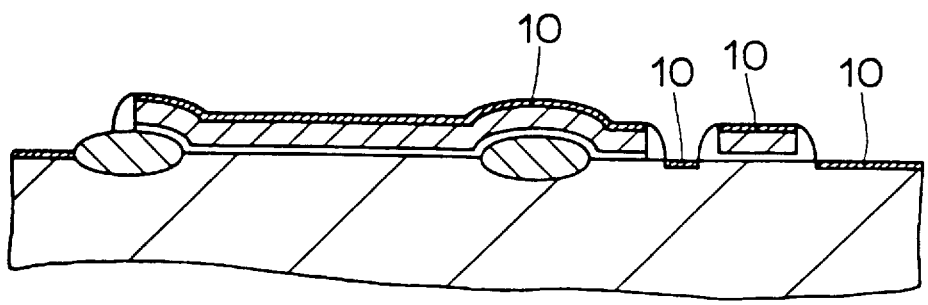
FIG. 6 is a sectional view showing the semiconductor device in a fifth step of the method of fabricating the semiconductor device according to the embodiment 1 of the present invention.

FIG. 1 is a sectional view showing a memory cell of an SRAM according to an embodiment 1 of the present invention. This memory cell comprises a silicon substrate 21. LOCOS oxide films 4 are provided in a surface of the silicon substrate 21. Gates 2 and 3 of an access transistor ATR2 and a driver transistor DTR1 are provided on the silicon substrate 21, to be adjacent to each other. A source/drain region 6 of the access transistor ATR2 is provided in the major surface of the silicon substrate 21 between the gates 3 and 2 of the driver transistor and the access transistor. A silicide layer 10 is formed on a surface of the source/drain layer 6. Such silicide layers 10 are also provided on surfaces of the gates 3 and 2 of the driver transistor and the access transistor respectively. An interlayer insulating film 11 is provided on the silicon substrate 21, to cover the gates 2 and 3. A contact hole 12 is provided in the interlayer insulating film 11, for exposing both of the surface of the source/drain layer 6 of the access transistor and an upper surface of an end of the gate 3 of the driver transistor. An internal wiring layer 14 for electrically connecting the surface of the end of the gate 3 of the driver transistor with the surface of the source/drain layer 6 of the access transistor is provided to cover a side wall surface and a bottom surface of the contact hole 12. This internal wiring layer 14 includes a titanium film 30 which is provided to be directly in contact with the side wall surface and the bottom surface of the contact hole 12, and a silicide layer 31 which is provided on the titanium film 30. An interlayer insulating film 15 is provided on the silicon substrate 21, to cover the internal wiring layer 15. A contact hole 16 is provided in the interlayer insulating film 15, to partially expose a surface of the internal wiring layer 14. A polysilicon film 17, which is a resistor, is provided on the silicon substrate 21, to be connected with the internal wiring layer 14 through the contact hole 16. A thick interlayer insulating film 18 is provided on the silicon substrate 21, to cover the polysilicon layer 17. A contact hole 19 is provided in the interlayer insulating film 18, for receiving a tungsten plug 33. The tungsten plug 33 is embedded in the contact hole 19, and connected with an aluminum wire 20.

According to this embodiment, the internal wiring layer 14, which is formed by the titanium film 30 and the silicide layer 31 provided on the titanium film 30, has low resistance.

A method of fabricating the semiconductor device according to the embodiment 1 of is now described.

First, steps shown in FIGS. 2A to 8B are carried out. These steps are similar to the conventional steps shown in FIGS. 30A to 35B, and hence portions identical to those shown in FIGS. 30A to 35B are denoted by the same reference numerals, to omit redundant description.

Figure 9:
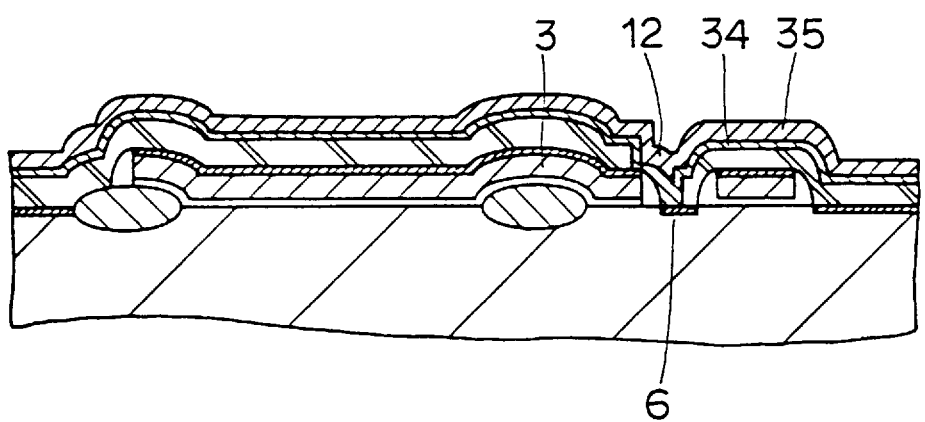
FIG. 9 is a sectional view showing the semiconductor device in an eighth step of the method of fabricating the semiconductor device according to the embodiment 1 of the present invention.
Figure 42:
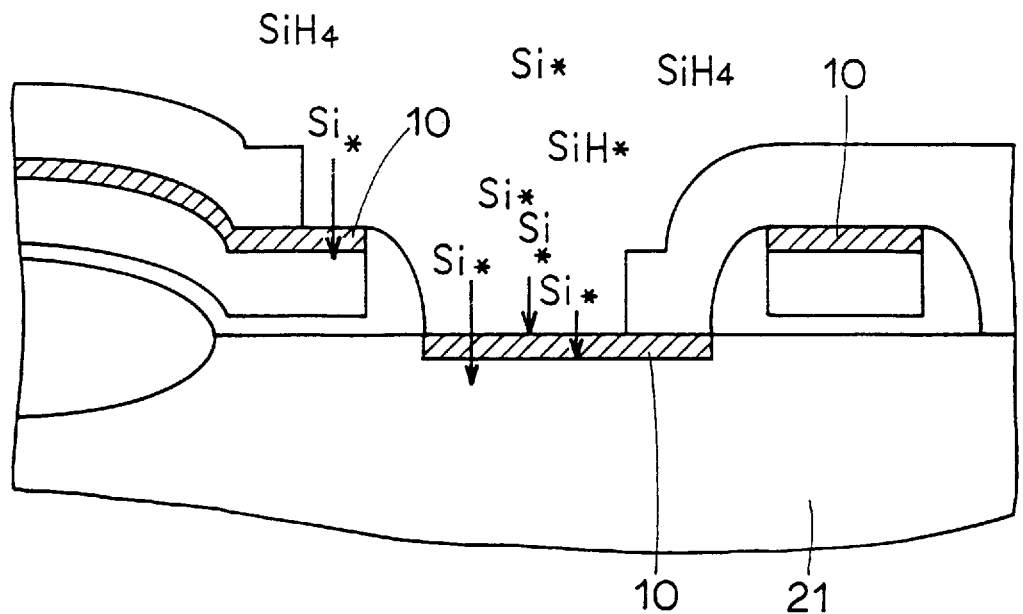
FIG. 42 is a sectional view of the semiconductor device for illustrating a problem of the conventional semiconductor device.
Figure 43:
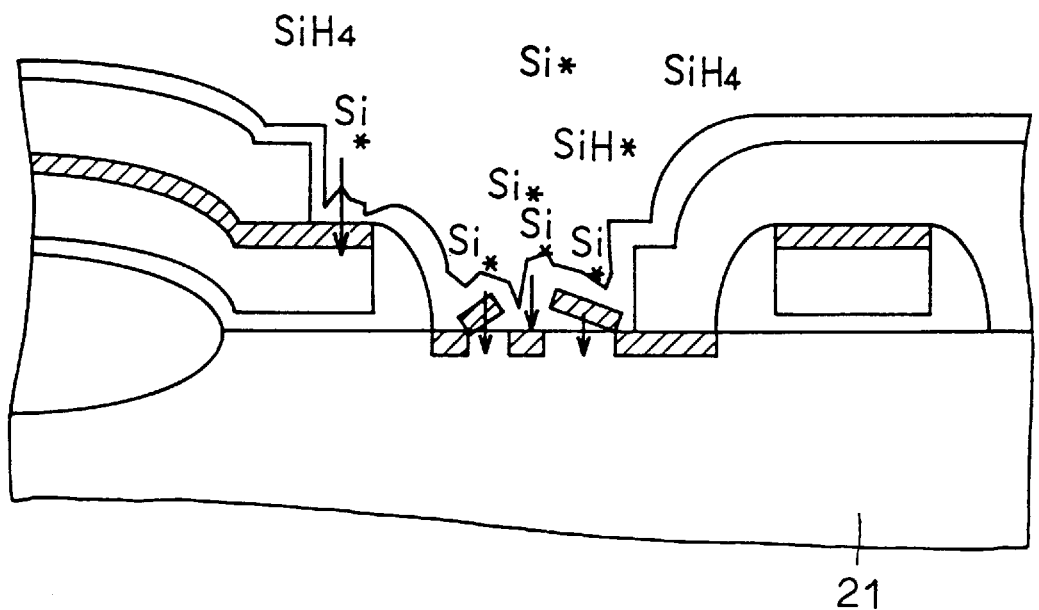
FIG. 43 is a sectional view of the semiconductor device for illustrating another problem of the conventional semiconductor device.

Referring to FIG. 9, a titanium film 34 for covering the side wall surface and the bottom surface of the contact hole 12 is formed by sputtering, to be in contact with the surface of the source/drain region 6 and that of the end of the gate 3 of the driver transistor. Since the titanium film 34 is formed by sputtering, no problem is caused dissimilarly to the prior art employing CVD (see FIGS. 42 and 43). The thickness of this titanium film 34 is about 200 Å. A titanium silicide film 35 is deposited on the titanium film 34 by sputtering, in a thickness of about 1500 Å. The titanium silicide film 35 which is formed by sputtering is not made of stable $TiSi_2$, but contains silicon slightly in excess. In order to convert the titanium silicide film 35 containing excess silicon to a stable $TiSi_2$ film, heat treatment is carried out through a lamp annealer at a temperature of about 800° C. Due to this heat treatment, the titanium silicide film 35 is stabilized and reduced in resistance.

Through such a series of steps, it is possible to attain contact of low resistance without deteriorating the surface of the titanium silicide film 35 provided on the surface of the source/drain region 6 and the gate 3. This is now described in further detail.

Figure 13:
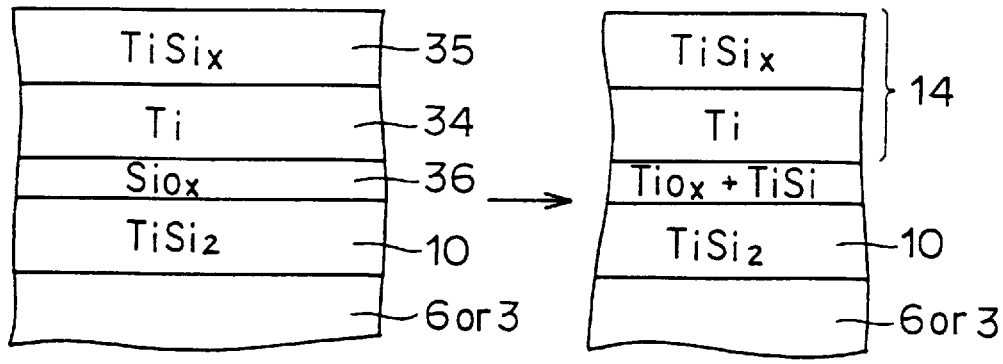
FIG. 13 is a diagram for illustrating a reducing action of a Ti film.

Referring to FIG. 13, a natural oxide film 36 is generally formed on the titanium silicide film 10 which is formed on the source/drain region 6 or the gate electrode 3. When the titanium film 34 is formed on the natural oxide film 36, however, the natural oxide film 36 is reduced by a reducing action of titanium into conductive $TiO_x$ and $TiSi_x$, through reaction expressed in the following formula:

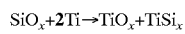

$$SiO_x + 2Ti \rightarrow TiO_x + TiSi_x$$

Thus, contact resistance between the internal wiring layer 14 and the source/drain region 6 is reduced as described later. Similarly, contact resistance between the internal wiring layer 14 and the gate 3 of the driver transistor is also reduced. Further, it is possible to suppress increase in wire resistance following miniaturization of the semiconductor device, since the titanium silicide film 35 is employed as the material for the internal wiring layer 14.

Figure 10A:
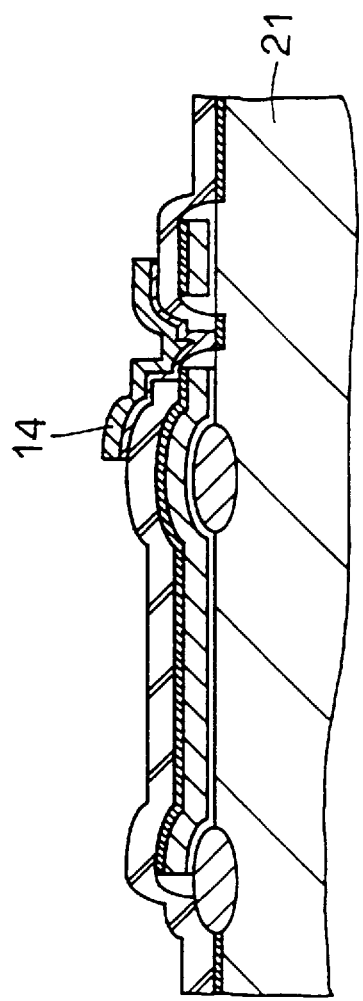
FIGS. 10A and 10B are sectional views and plan views showing the semiconductor device in a ninth step of the method of fabricating the semiconductor device according to the embodiment 1 of the present invention respectively.
Figure 10B:
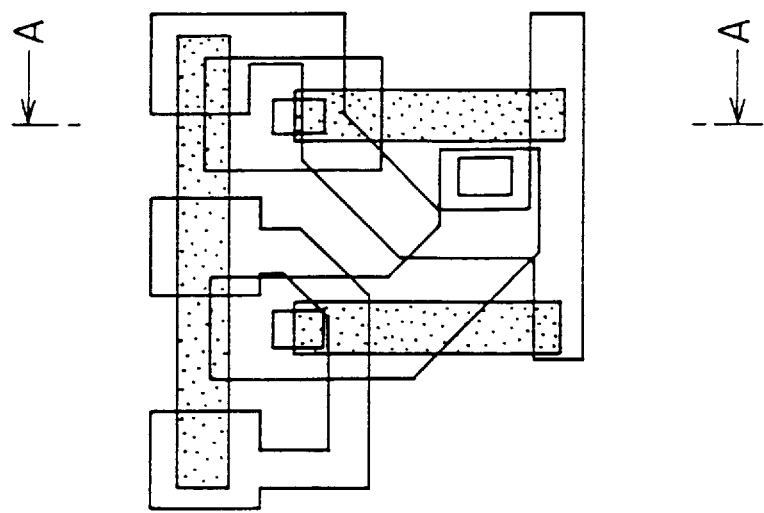
Figures 11A, 11B:
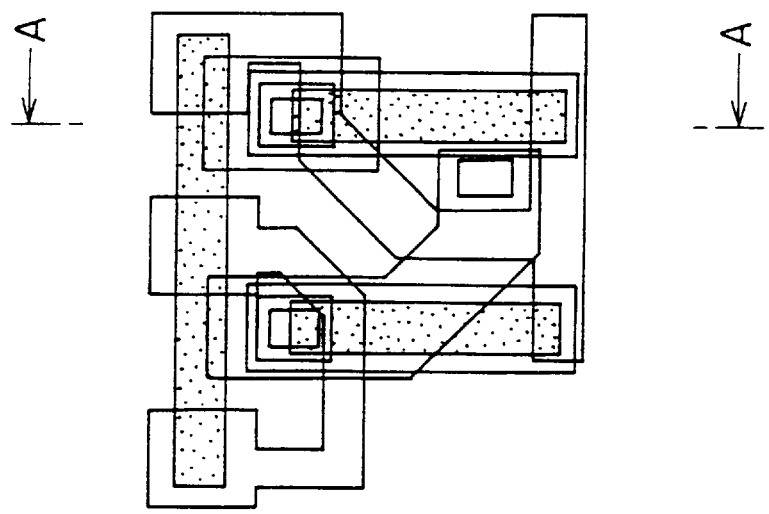
FIGS. 11A and 11B are sectional views and plan views showing the semiconductor device in a tenth step of the method of fabricating the semiconductor device according to the embodiment 1 of the present invention respectively.
Figure 12A:
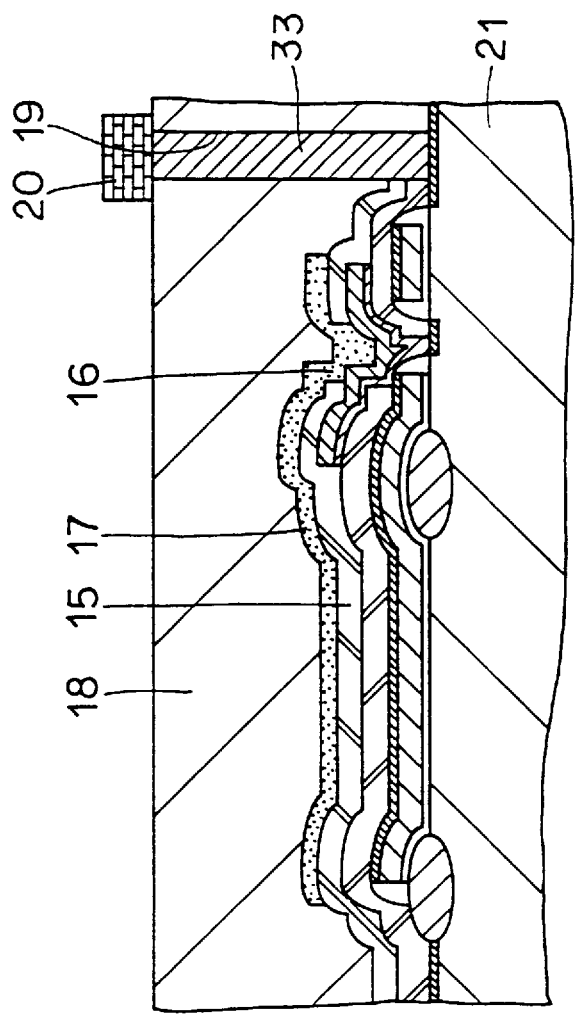
FIGS. 12A and 12B are sectional views and plan views showing the semiconductor device in an eleventh step of the method of fabricating the semiconductor device according to the embodiment 1 of the present invention respectively.
Figure 12B:
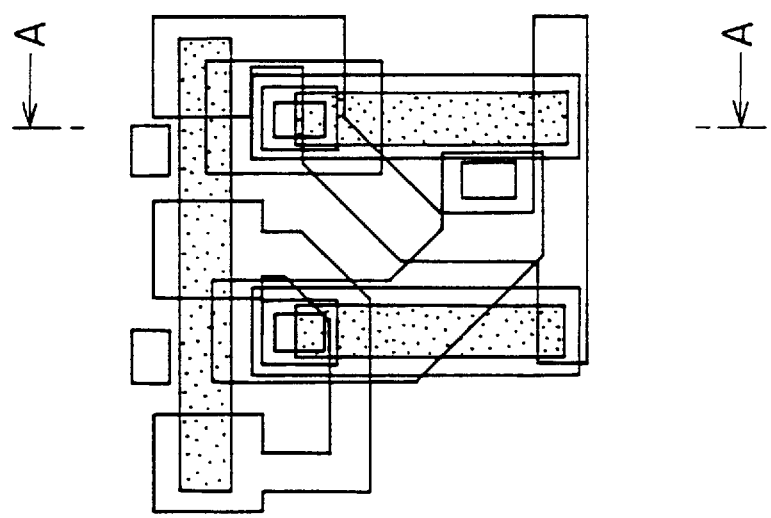

Referring to FIGS. 9, 10A and 10B, the titanium film 34 and the titanium silicide film 35 are patterned in the form of the internal wiring layer 14. Referring to FIGS. 11A and 11B, the interlayer insulating film 15, which is an oxide film of 1500 Å in thickness, is deposited on the silicon substrate 21, to cover the internal wiring layer 14. The contact hole 16 is formed in the interlayer insulating film 15, for partially exposing the surface of the internal wiring layer 14. The polysilicon film 17 of 1500 Å in thickness for attaining high resistance is formed to be connected with the internal wiring layer 14 and embedded in the contact hole 16. The polysilicon film 17 is patterned in the form of a high resistance resistor. The thick interlayer insulating film 18 is formed on the silicon substrate 21, to cover the polysilicon film 17. The contact hole 19 for receiving the tungsten plug 33 is formed in the interlayer insulating film 18. The tungsten plug 33 is embedded in the contact hole 19. The aluminum wire 20 is formed to be connected with the tungsten plug 33.

Embodiment 2

Figure 14:
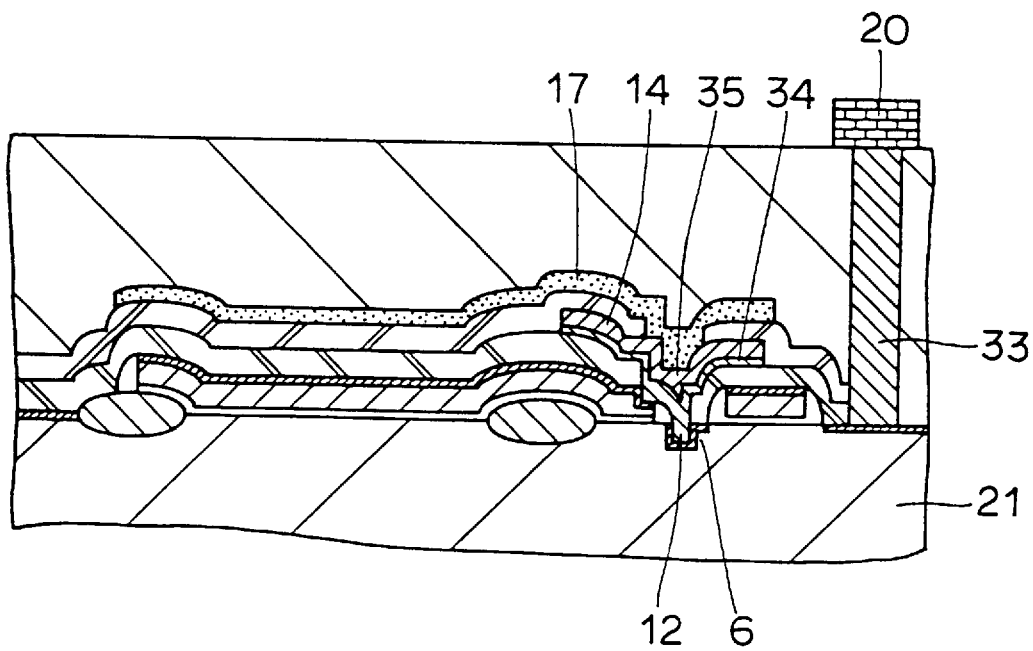
FIG. 14 is a sectional view showing a memory cell of an SRAM according to an embodiment 2 of the present invention.
Figure 15B:
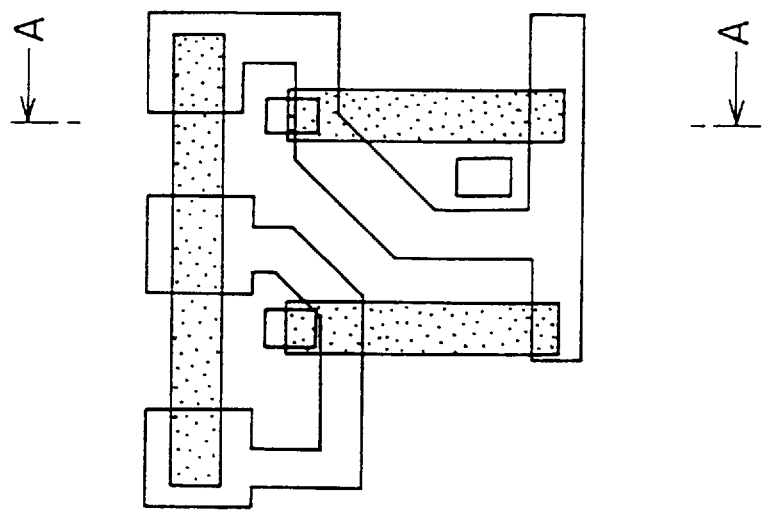
FIGS. 15A and 15B are sectional views and plan views showing the semiconductor device in a first step of a method of fabricating the semiconductor device according to the embodiment 2 of the present invention respectively.
Figure 15A:
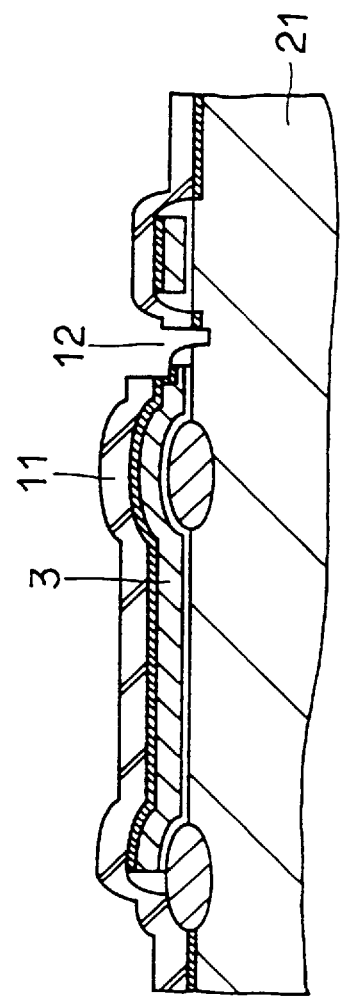

FIG. 14 is a sectional view showing a memory cell of a static random access memory according to an embodiment 2 of the present invention.

The memory cell according to the embodiment 2 is identical to that according to the embodiment 1 of except the following point, and hence portions of the former which are identical or corresponding to those of the latter are denoted by the same reference numerals, to omit redundant description.

The memory cell according to the embodiment 2 is different from that of the embodiment 1 of in a point that a contact hole 12 is formed to bore through a surface of a silicon substrate 21. Consequently, a titanium film 34 penetrates the surface of the silicon substrate 21. In the memory cell according to the embodiment 2, a contact area between the titanium film 34 and a source/drain region 6 is increased, thereby forming stable contact of lower resistance.

A method of fabricating the memory cell of the SRAM shown in FIG. 14 is now described.

First, steps identical to those shown in FIGS. 2A to 7B are carried out.

Referring to FIGS. 7A, 7B, 15A and 15B, an interlayer insulating film 11 is employed as a mask for forming the contact hole 12 to expose a surface of the source/drain region 6 and that of an end of a gate 3 of a driver transistor. The contact hole 12 is so formed as to bore through the surface of the silicon substrate 21. When etching is so carried out as to bore through the surface of the silicon substrate 21, a silicide layer 10 is removed from a bottom portion of the contact hole 12.

Figure 16:
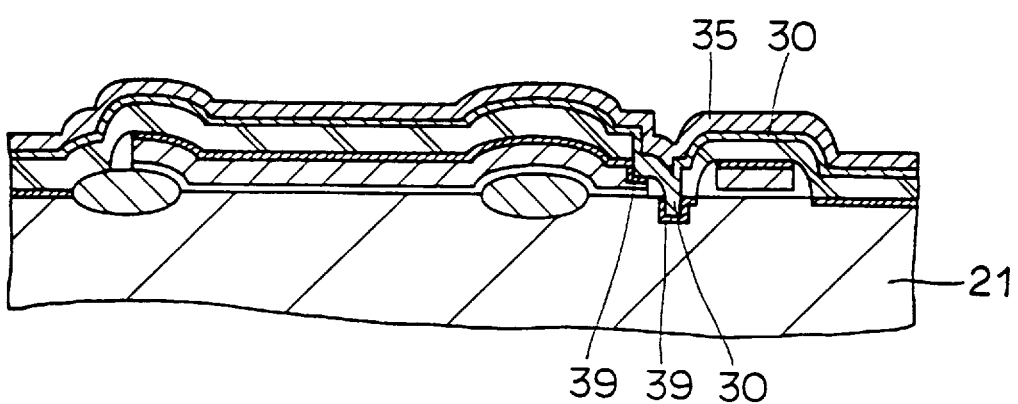
FIG. 16 is a sectional view showing the semiconductor device in a second step of the method of fabricating the semiconductor device according to the embodiment 2 of the present invention.

Referring to FIG. 16, a titanium film 30 is deposited on the silicon substrate 21 by sputtering, to cover a side wall surface and a bottom surface of the contact hole 12. A titanium silicide film 35 is deposited on the titanium film 30 by sputtering.

In order to attain excellent contact between the titanium film 30 and the silicon substrate 21, heat treatment is thereafter carried out by a lamp annealer at a temperature of about 800° C. Due to the heat treatment, titanium is reacted with silicon to form a titanium silicide layer 39 in an interface therebetween, thereby reducing contact resistance. According to this embodiment, the contact area between the titanium film 30 and the silicon substrate 21 is increased, thereby forming stable contact of lower resistance.

Figure 17A:
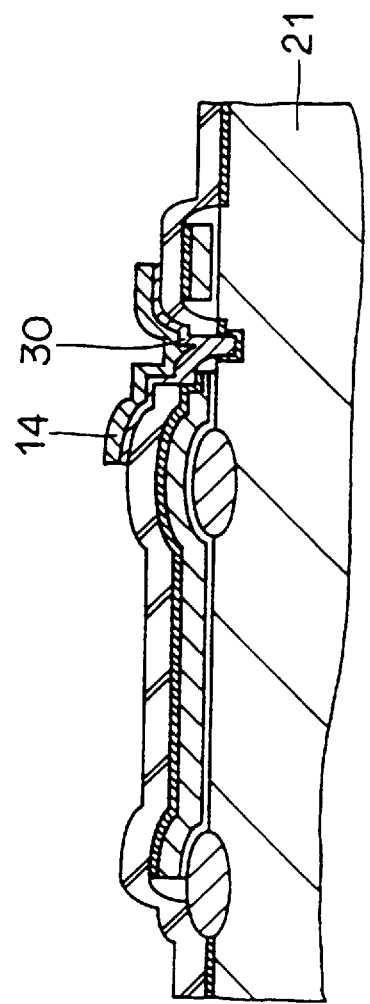
FIGS. 17A and 17B are sectional views and plan views showing the semiconductor device in a third step of the method of fabricating the semiconductor device according to the embodiment 2 of the present invention respectively.
Figure 17B:
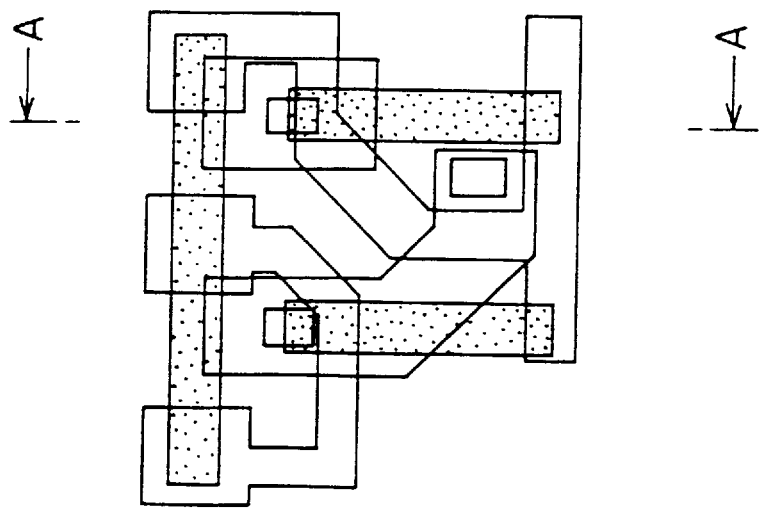

Referring to FIGS. 16, 17A and 17B, the titanium silicide film 35 and the titanium film 30 are patterned in the form of an internal wiring layer 14.

Figure 18B:
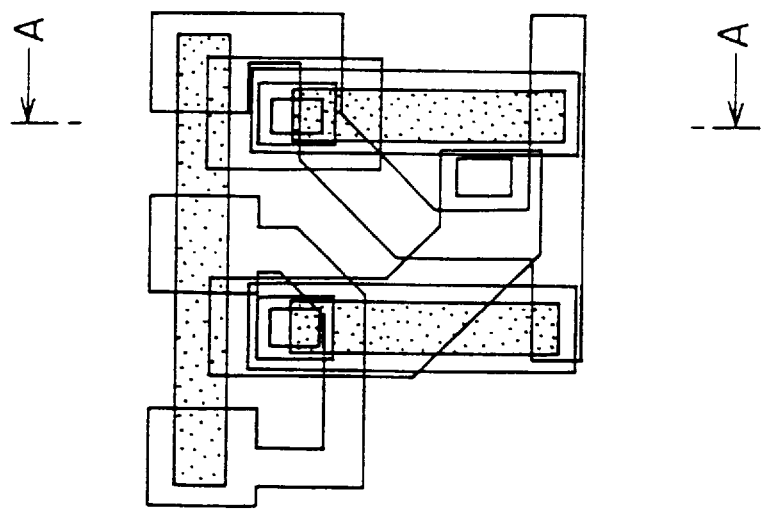
FIGS. 18A and 18B are sectional views and plan views showing the semiconductor device in a fourth step of the method of fabricating the semiconductor device according to the embodiment 2 of the present invention respectively.
Figure 18A:
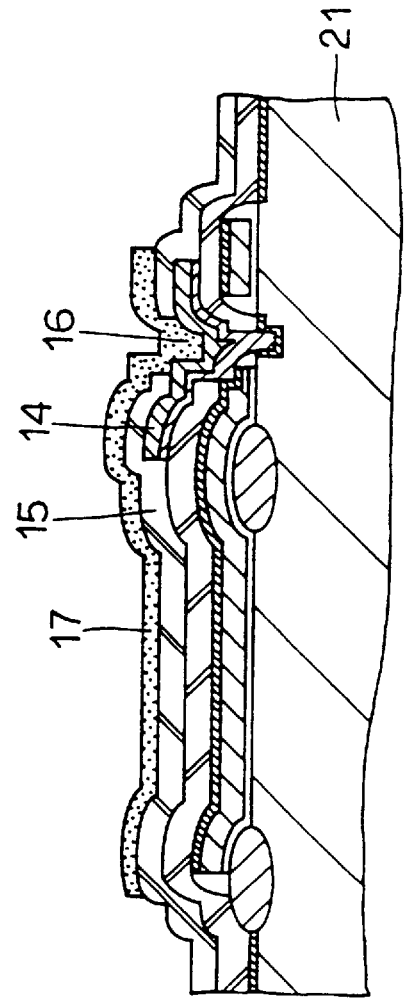

Referring to FIGS. 18A and 18B, an interlayer insulating film 15 is formed on the silicon substrate 21, to cover the internal wiring layer 14. The thickness of the interlayer insulating film 15 is about 1500 Å. A contact hole 16 is formed in the interlayer insulating film 15, for partially exposing a surface of the internal wiring layer 14. A polysilicon film 17 of 1000 Å in thickness is deposited on the silicon substrate 21, to be embedded in the contact hole 16. The polysilicon film 17 is patterned in the form of a high-resistance resistor.

Referring to FIGS. 19A and 19B, a thick interlayer insulating film 18 is formed on the silicon substrate 21, to cover the polysilicon film 17. A contact hole 32 for receiving a tungsten plug 33 is formed in the interlayer insulating film 18. The tungsten plug 33 is embedded in the contact hole 32, and an aluminum wire 20 is connected to the tungsten plug 33.

Embodiment 3

Figure 20:
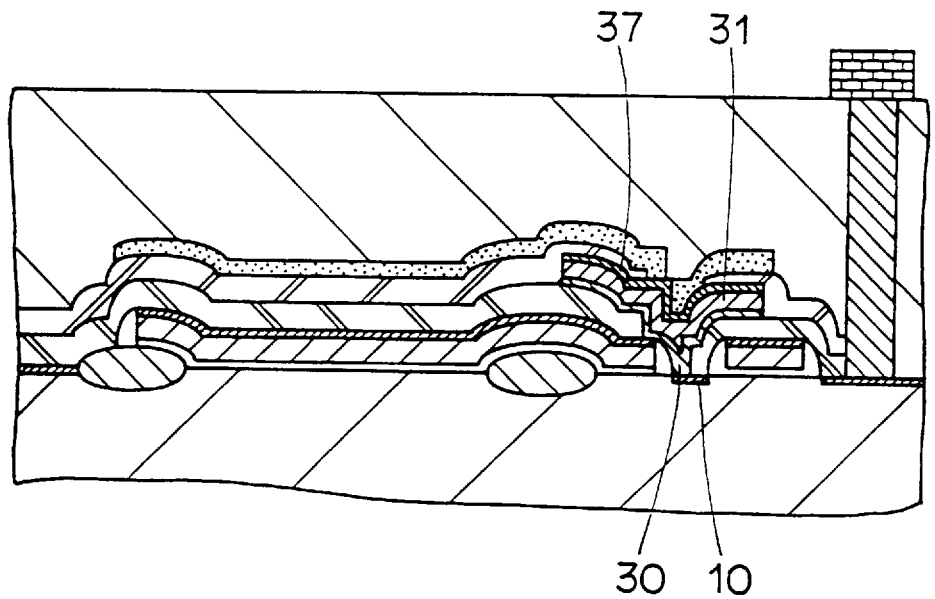
FIG. 20 is a sectional view showing a memory cell of an SRAM according to an embodiment 3 of the present invention.

FIG. 20 is a sectional view showing a memory cell of an SRAM according to an embodiment 3 of the present invention. The memory cell of the SRAM shown in FIG. 20 is identical to that shown in FIG. 1 except the following point, and hence portions of the former which are identical or corresponding to those of the latter are denoted by the same reference numerals, to omit redundant description.

The memory cell of the SRAM shown in FIG. 20 is different from that shown in FIG. 1 in a point that an internal wiring layer 14 is formed by a titanium film 30 which is in contact with a first silicide layer (10), a second silicide layer 31 which is provided on the titanium film 30, and a third silicide layer 37 which is provided on the second silicide layer 31. Due to the provision of the third silicide layer 37 on the second silicide layer 31, the internal wiring layer 14 is further reduced in resistance.

A method of fabricating the memory cell of the SRAM shown in FIG. 20 is now described.

First, steps similar to those shown in FIGS. 2A to 7B are carried out.

Figure 7A:
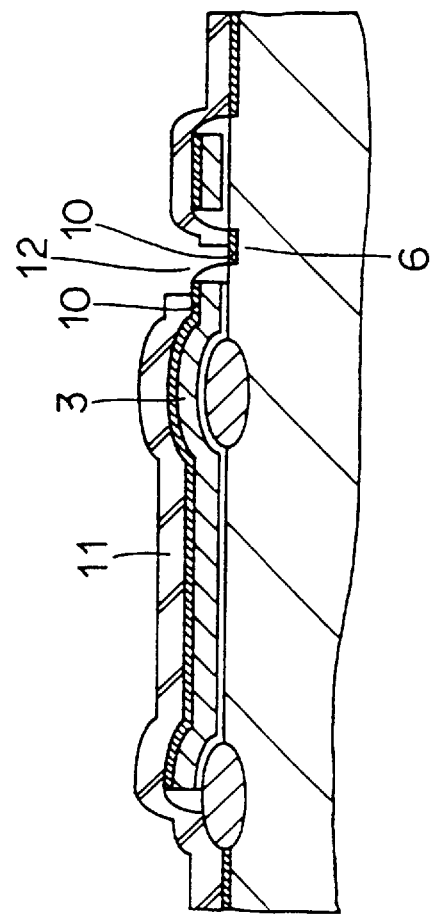
FIGS. 7A and 7B are sectional views and plan views showing the semiconductor device in a sixth step of the method of fabricating the semiconductor device according to the embodiment 1 of the present invention respectively.
Figure 7B:
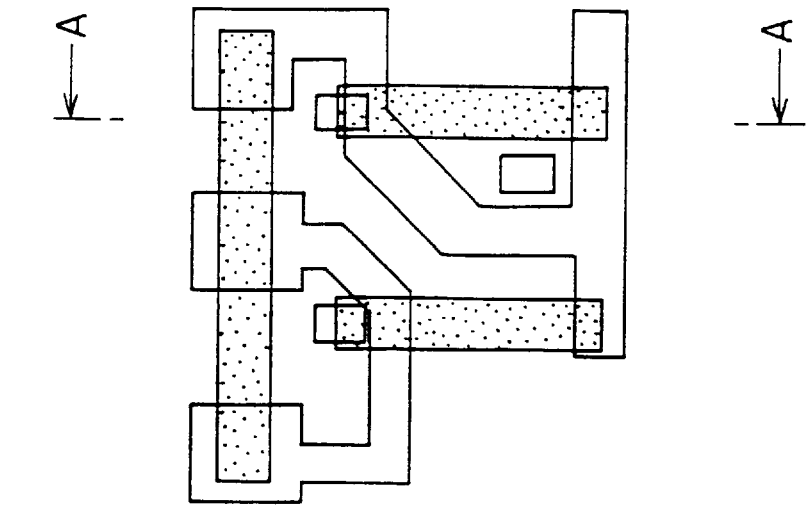
Figure 8A:
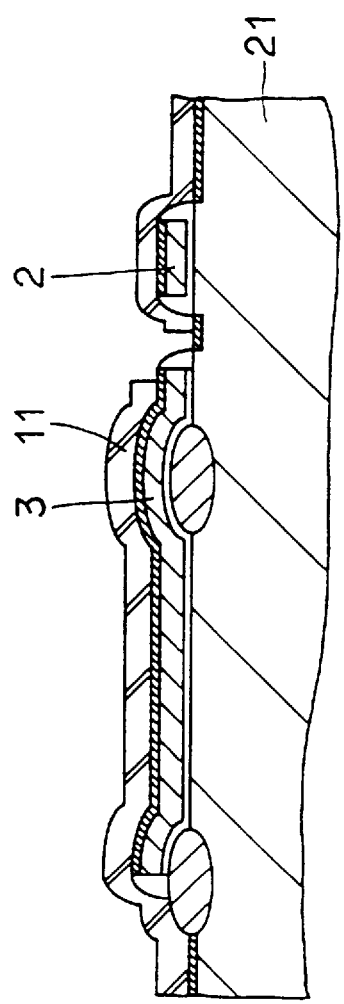
FIGS. 8A and 8B are sectional views and plan views showing the semiconductor device in a seventh step of the method of fabricating the semiconductor device according to the embodiment 1 of the present invention respectively.
Figure 8B:
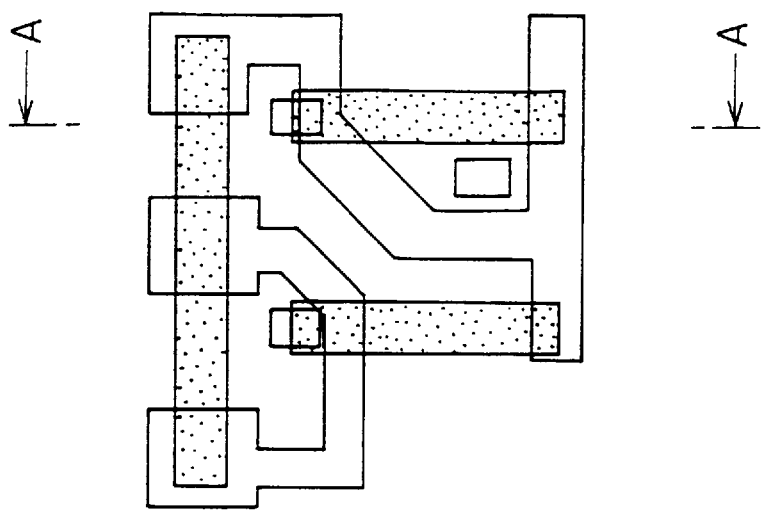
Figure 21A:
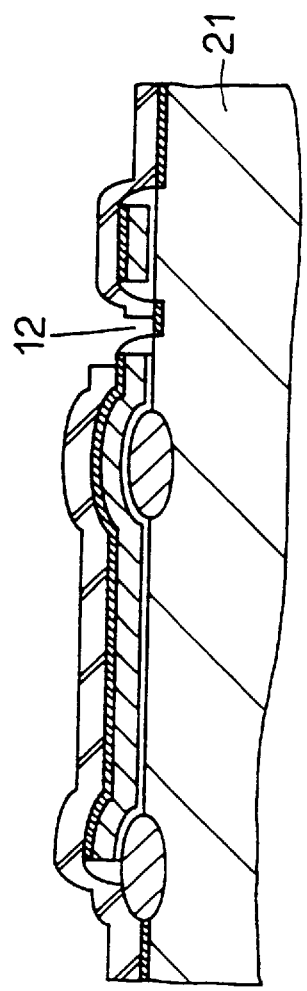
FIGS. 21A and 21B are sectional views and plan views showing the semiconductor device in a first step of a method of fabricating the semiconductor device according to the embodiment 3 of the present invention respectively.
Figure 21B:
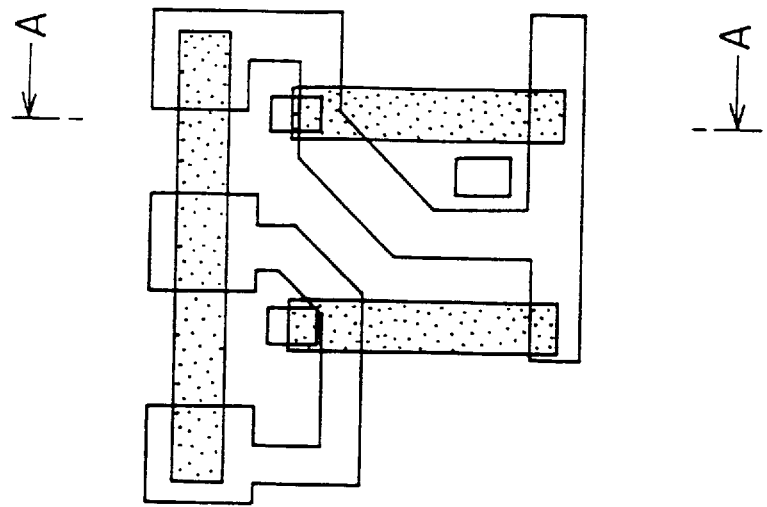

FIGS. 21A and 21B are a sectional view and a plan view corresponding to FIGS. 7A and 7B respectively.

Figure 22:
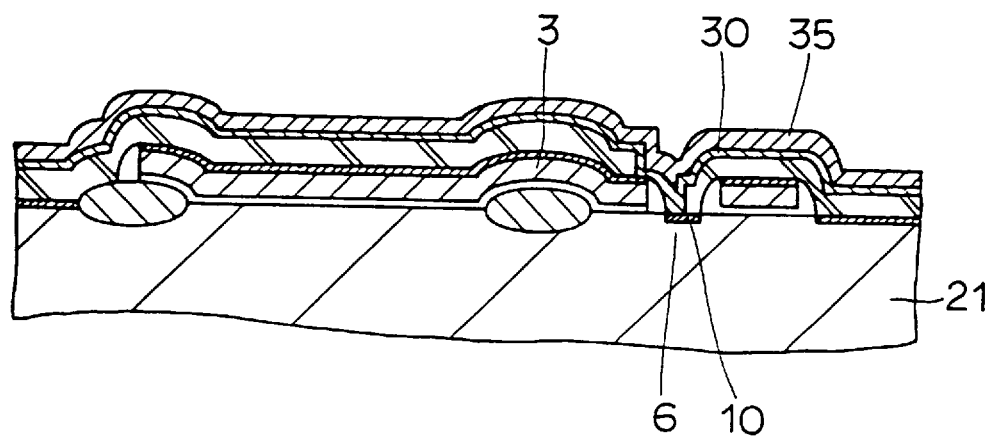
FIG. 22 is a sectional view showing the semiconductor device in a second step of the method of fabricating the semiconductor device according to the embodiment 3 of the present invention.

Referring to FIGS. 21A, 21B and 22, the titanium film 30 of about 200 Å in thickness is deposited on a silicon substrate 21 by sputtering, to cover a side wall surface and a bottom surface of a contact hole 12. Then, a titanium silicide film 35 is deposited on the titanium film 30, in a thickness of about 1500 Å. The titanium silicide film 35 which is formed by sputtering is not in a stable $TiSi_2$ structure, but contains silicon slightly in excess. In order to convert this titanium silicide film 35 to a stable $TiSi_2$ film, heat treatment is carried out by a lamp annealer at a temperature of about 800° C. Through the aforementioned series of steps, it is possible to obtain low-resistance contact without deteriorating silicide layers 10 which are provided on a source/drain region 6 and a surface of a gate 3. Since the titanium silicide film 35 is employed as a wiring material, further, it is possible to suppress increase in wire resistance following miniaturization of the semiconductor device.

Figure 23:
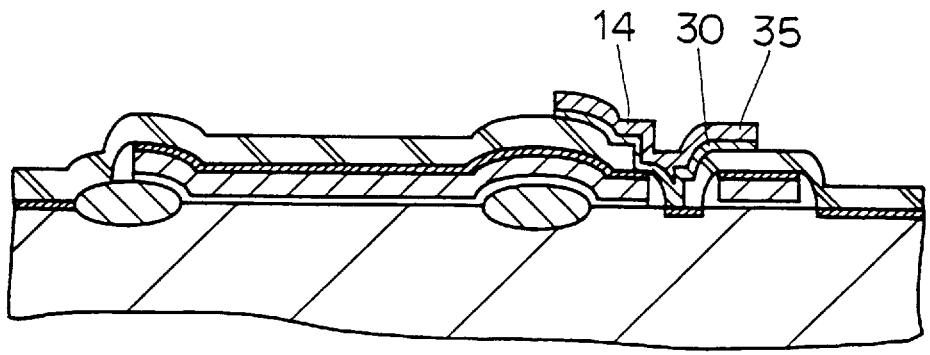
FIG. 23 is a sectional view showing the semiconductor device in a third step of the method of fabricating the semiconductor device according to the embodiment 3 of the present invention.

Referring to FIGS. 22 and 23, the titanium silicide film 35 and the titanium film 30 are patterned in the form of the internal wiring layer 14, by photolithography and RIE.

Figure 24:
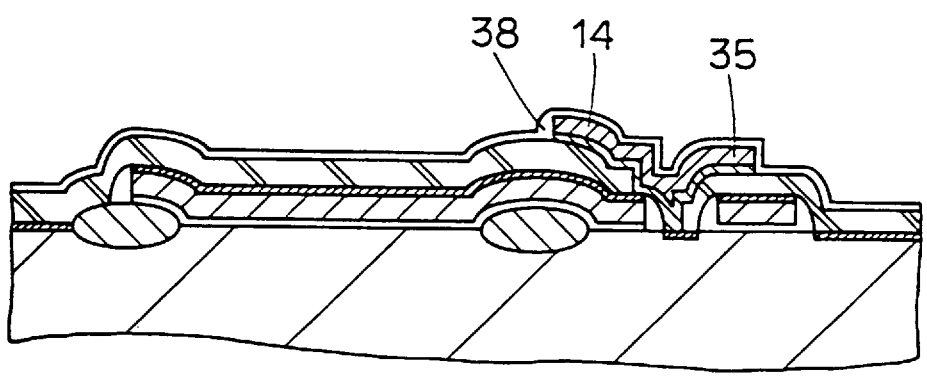
FIG. 24 is a sectional view showing the semiconductor device in a fourth step of the method of fabricating the semiconductor device according to the embodiment 3 of the present invention.

Referring to FIG. 24, the titanium film 38 of about 500 Å in thickness is deposited on the silicon substrate 21 by sputtering to cover a surface of the internal wiring layer 14, and thereafter heat treatment is carried out at a temperature of about 700° C. This heat treatment is performed for the following reason:

Titanium and silicon contained in the titanium silicide film 35 which is deposited by sputtering are not at a composition ratio of 1:2 for a stable and low-resistance titanium silicide film, but at a ratio of 1:2.2 with excess silicon. Such excess silicon is precipitated by later heat treatment, to bring this film (35) into a composite structure of $TiSi_2$ and Si films. The precipitated silicon is at high resistance since no impurity is implanted, to cause disconnection of a portion of the internal wiring layer 14 when a large amount of Si is precipitated in this portion. In order to prevent this, it is necessary to reduce the resistance of the silicon as precipitated. The aforementioned heat treatment is carried out for solving this problem, and the titanium film 38 is so deposited on the titanium silicide film 35 as to react the titanium with the precipitated silicon, thereby forming $TiSi_2$.

Figure 25B:
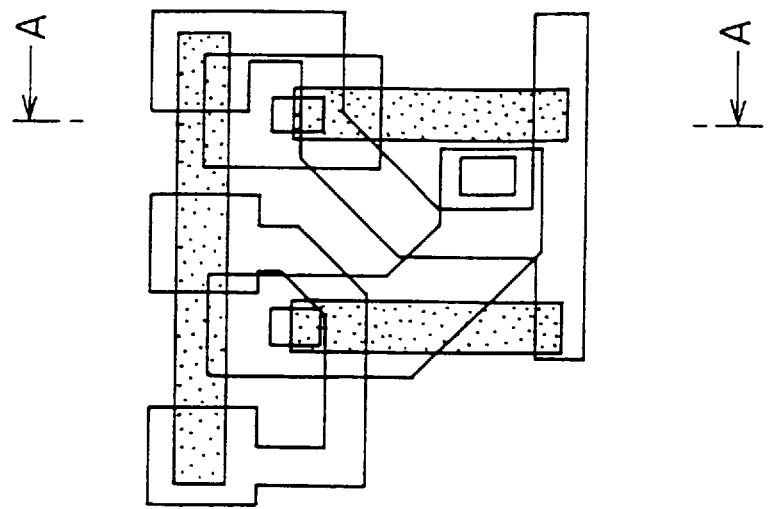
FIGS. 25A and 25B are sectional views and plan views showing the semiconductor device in a fifth step of the method of fabricating the semiconductor device according to the embodiment 3 of the present invention respectively.
Figure 25A:
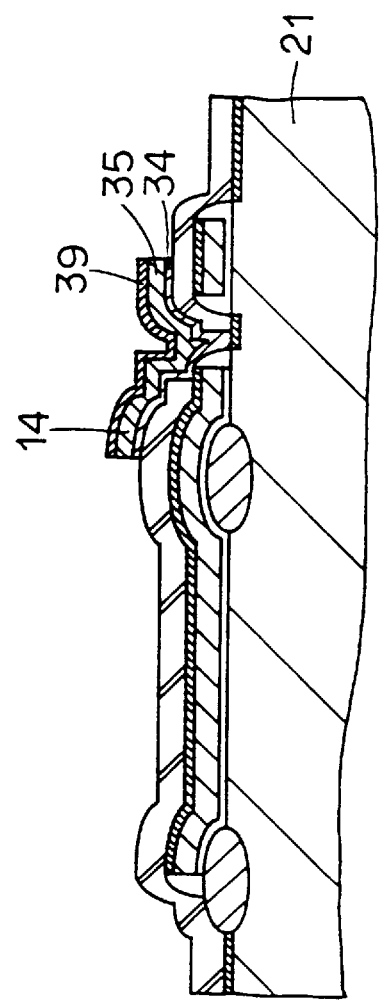

Referring to FIGS. 24, 25A and 25B, unreacted titanium and titanium nitride which is formed by nitrogen contained in the atmosphere as employed are removed after the heat treatment at 700° C., by a solution of sulfuric acid and aqueous hydrogen peroxide. Thereafter heat treatment is carried out at a temperature of about 800° C., in order to form a stable $TiSi_2$ film (39). Thus, it is possible to obtain a semiconductor device of high performance without causing disconnection by precipitation of silicon.

Figure 26B:
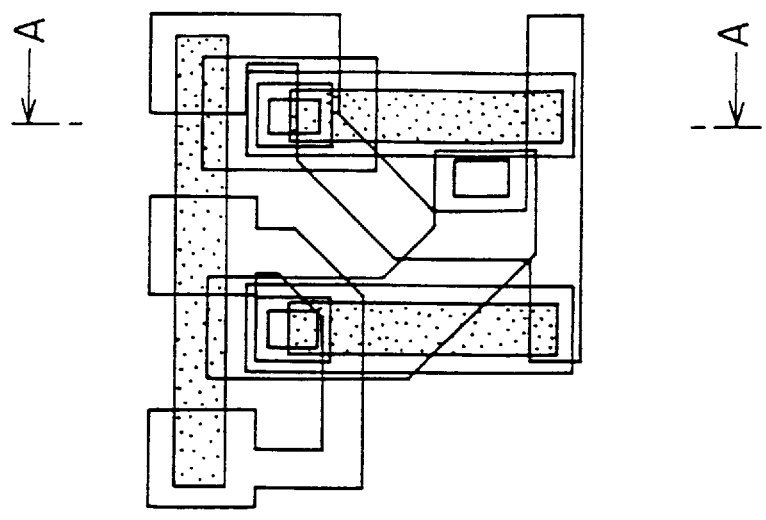
FIGS. 26A and 26B are sectional views and plan views showing the semiconductor device in a sixth step of the method of fabricating the semiconductor device according to the embodiment 3 of the present invention respectively.
Figure 26A:
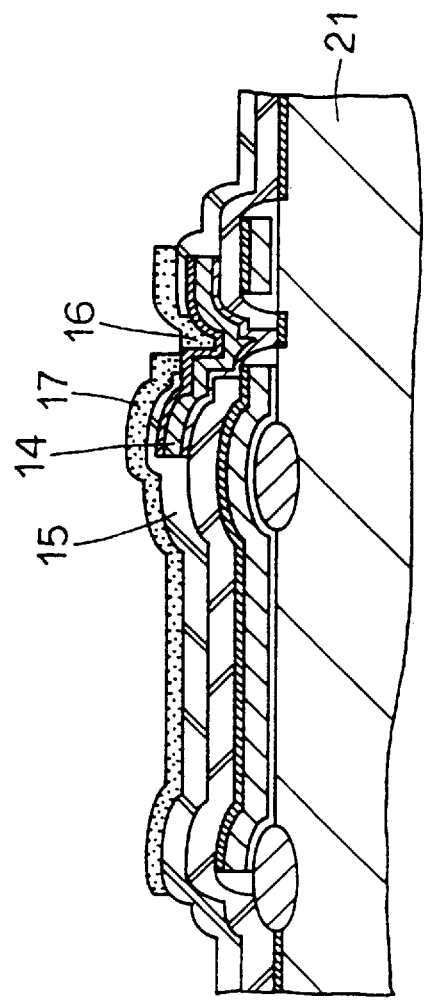

Referring to FIGS. 26A and 26B, an interlayer insulating film 15 is formed on the silicon substrate 21, to cover the internal wiring layer 14. A contact hole 16 is formed in the interlayer insulating film 15, for partially exposing the surface of the internal wiring layer 14. A polysilicon film 17 is formed on the silicon substrate 21, to be embedded in the contact hole 16. The thickness of the polysilicon film 17 is about 1000 Å. The polysilicon film 17 is patterned in the form of a high-resistance resistor.

Figure 27B:
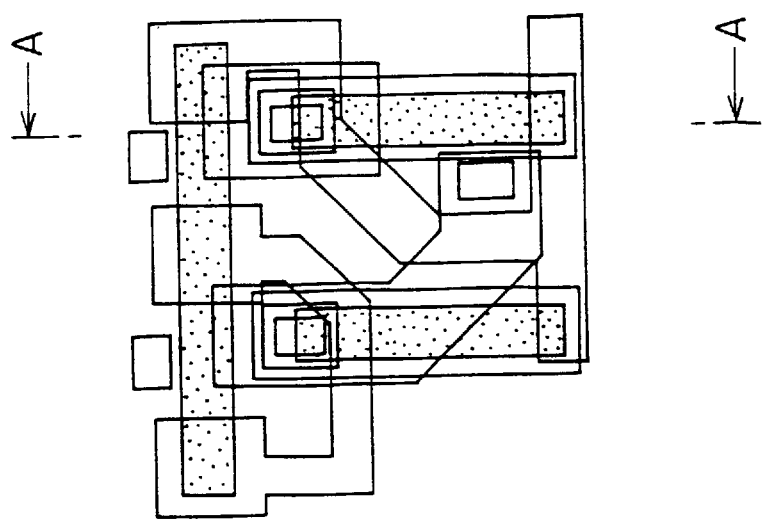
FIGS. 27A and 27B are sectional views and plan views showing the semiconductor device in a seventh step of the method of fabricating the semiconductor device according to the embodiment 3 of the present invention respectively.
Figure 27A:
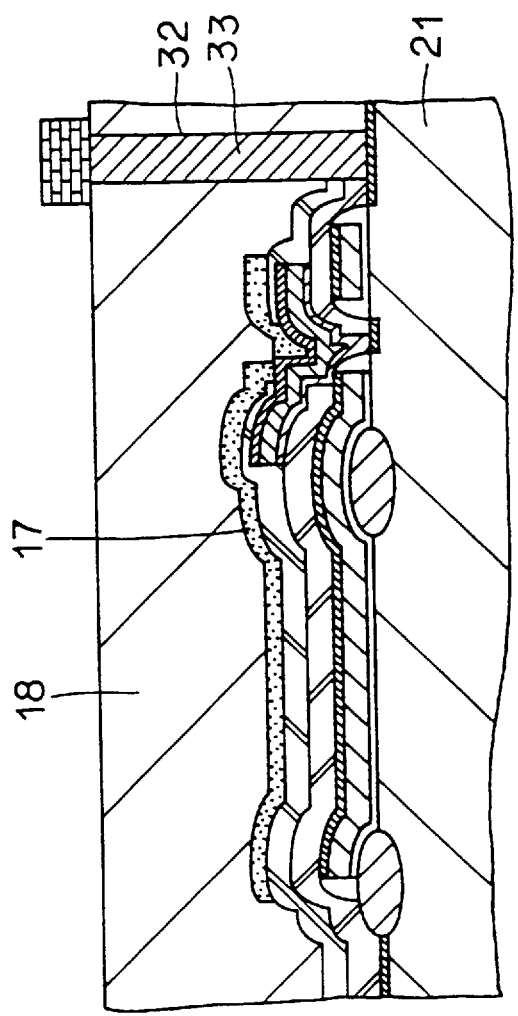
Figure 28:
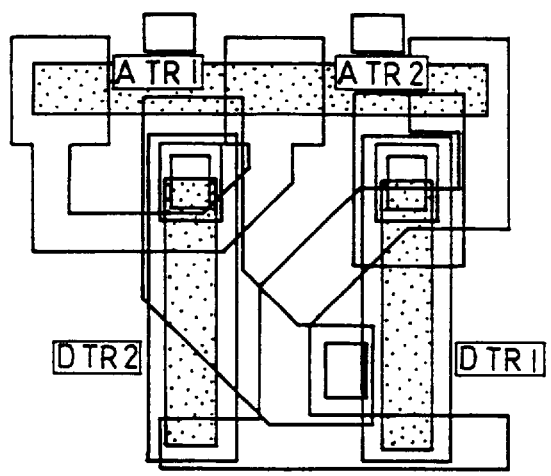
FIG. 28 is a plan view showing a memory cell of a conventional SRAM.
Figure 29:
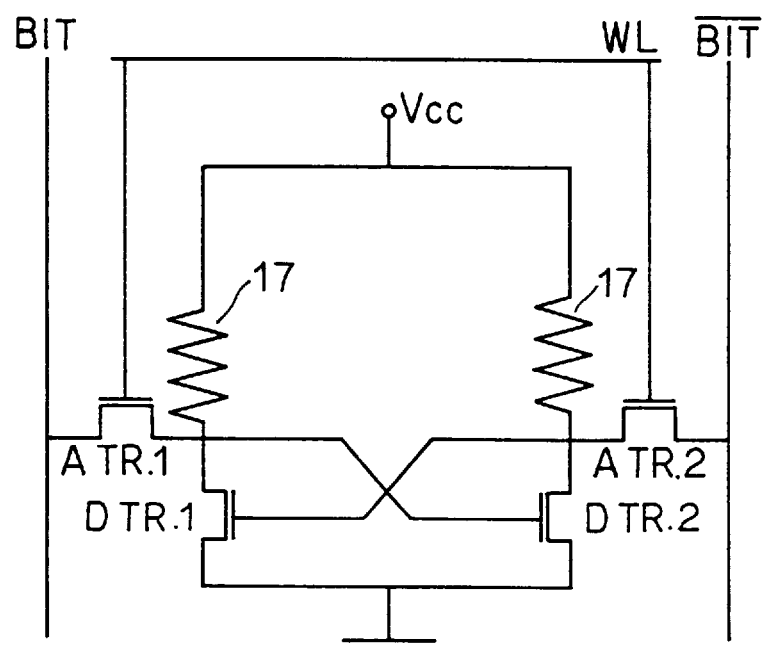
FIG. 29 is an equivalent circuit diagram of the memory cell of the conventional SRAM.
Figure 30B:
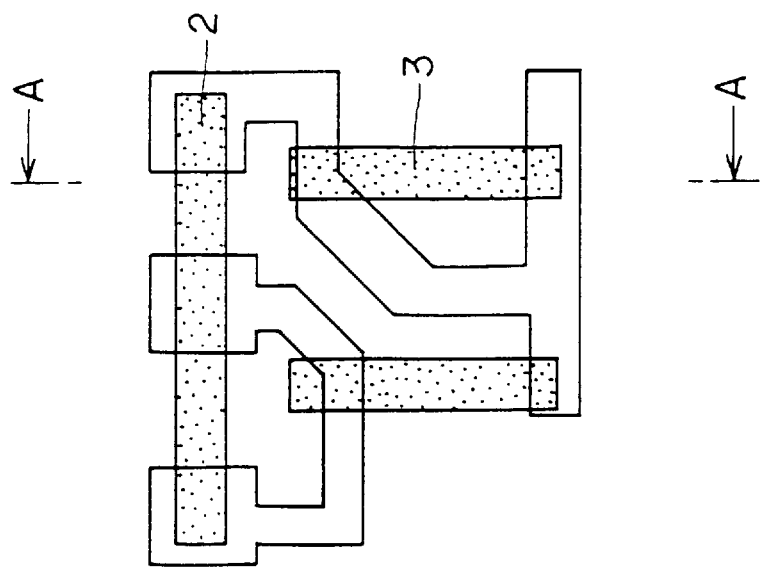
FIGS. 30A and 30B are sectional views and plan views showing the semiconductor device in a first step of a method of fabricating the conventional semiconductor device respectively.
Figure 30A:
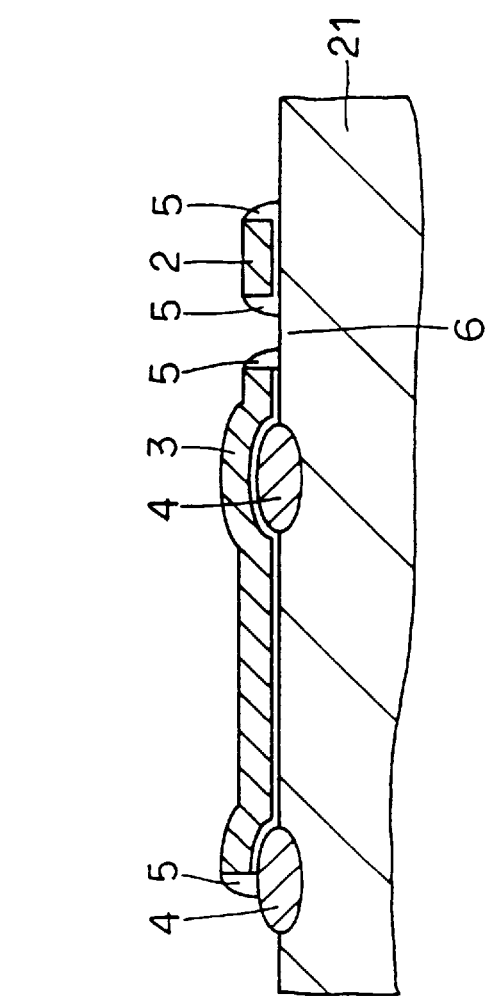
Figure 31:
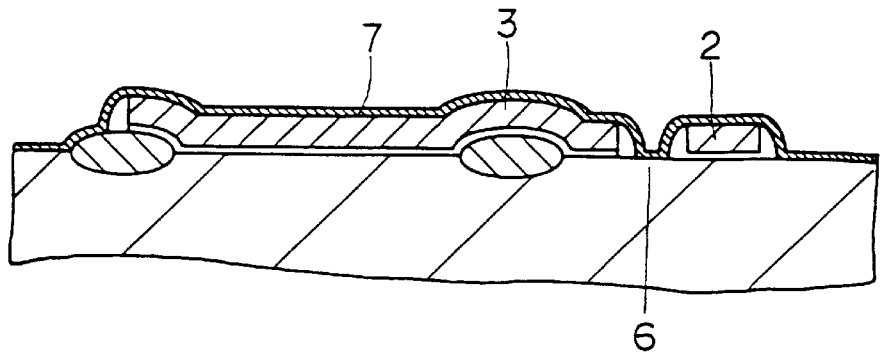
FIG. 31 is a sectional view showing the semiconductor device in a second step of the method of fabricating the conventional semiconductor device.
Figure 33:
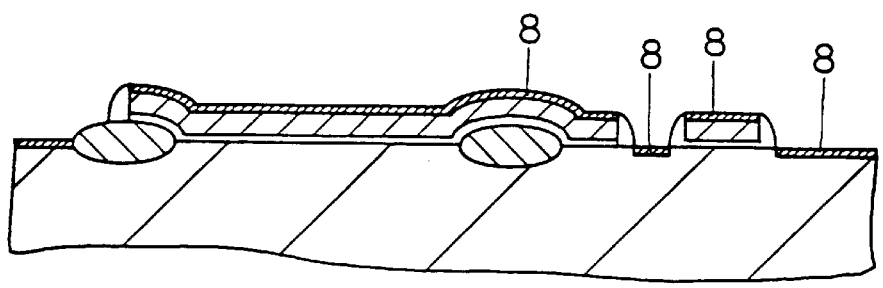
FIG. 33 is a sectional view showing the semiconductor device in a fourth step of the method of fabricating the conventional semiconductor device.
Figure 34:
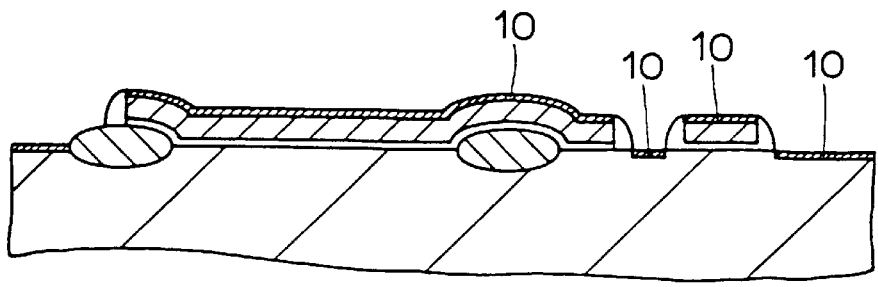
FIG. 34 is a sectional view showing the semiconductor device in a fifth step of the method of fabricating the conventional semiconductor device.
Figure 32A:
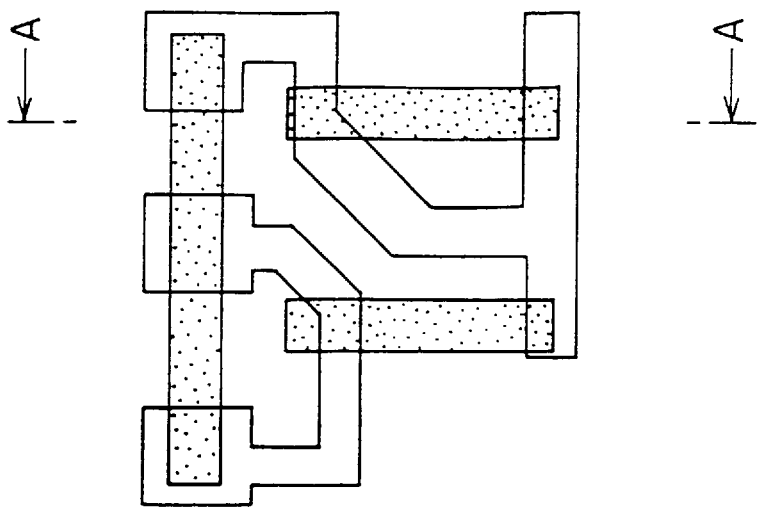
FIGS. 32A and 32B are sectional views and plan views showing the semiconductor device in a third step of the method of fabricating the conventional semiconductor device respectively.
Figure 32B:
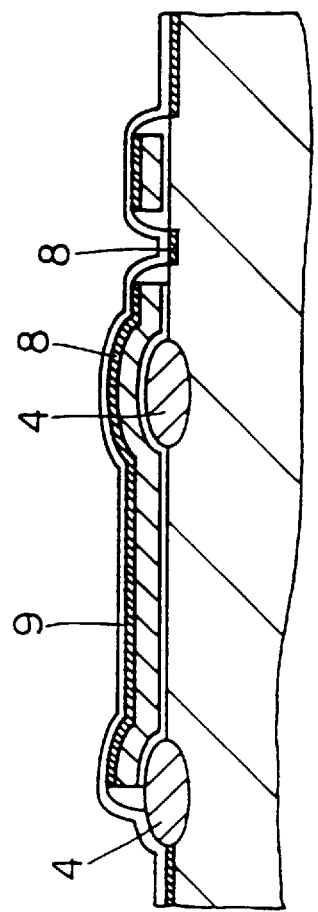
Figure 35B:
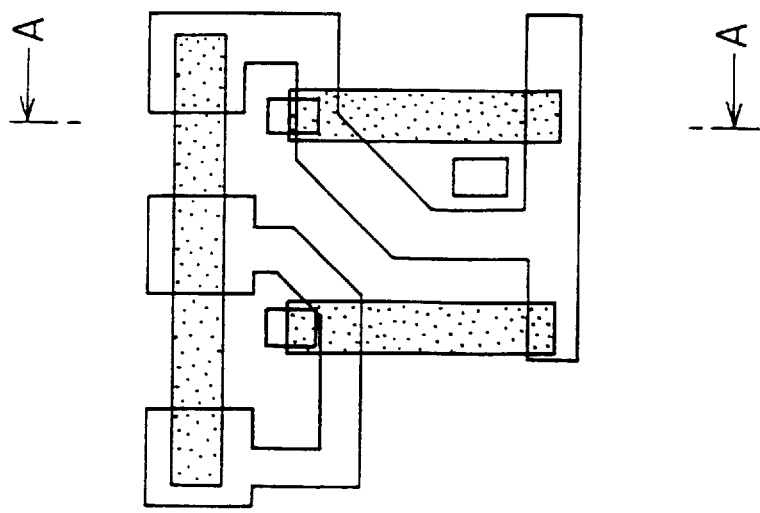
FIGS. 35A and 35B are sectional views and plan views showing the semiconductor device in a sixth step of the method of fabricating the conventional semiconductor device respectively.
Figure 35A:
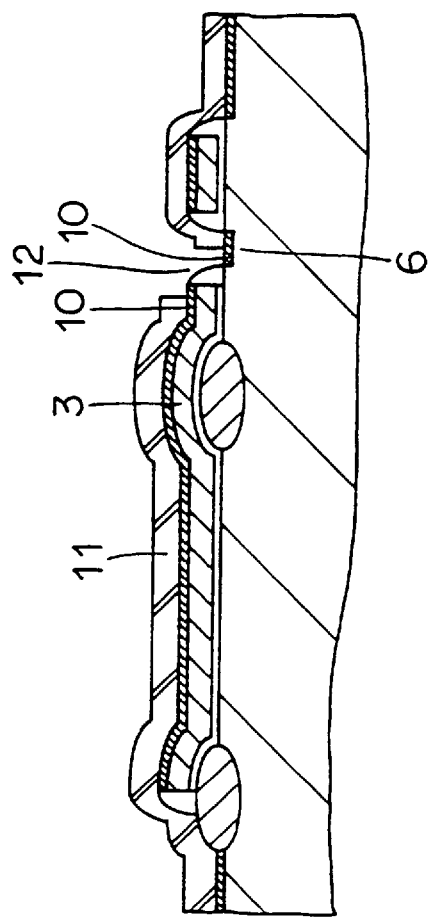
Figure 36:
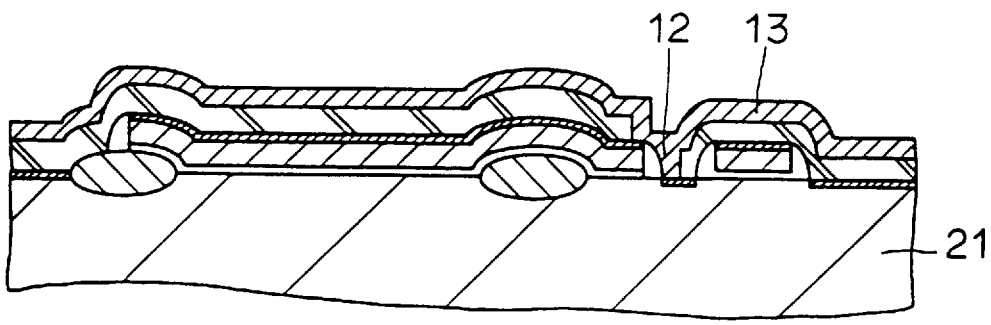
FIG. 36 is a sectional view showing the semiconductor device in a seventh step of the method of fabricating the conventional semiconductor device.
Figure 38:
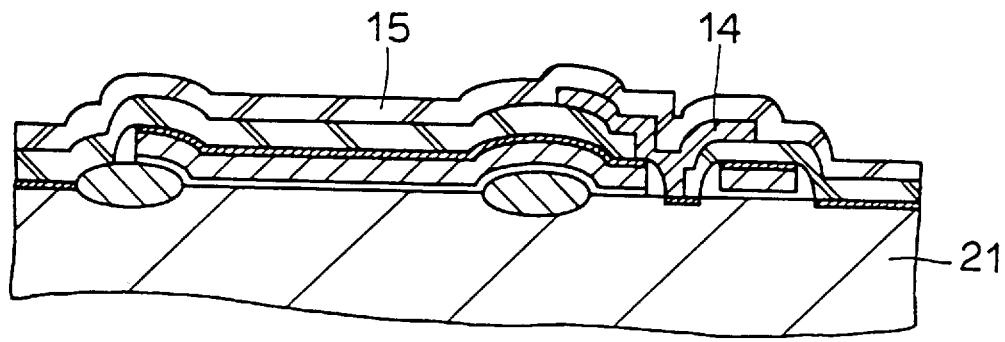
FIG. 38 is a sectional view showing the semiconductor device in a ninth step of the method of fabricating the conventional semiconductor device.
Figure 37A:
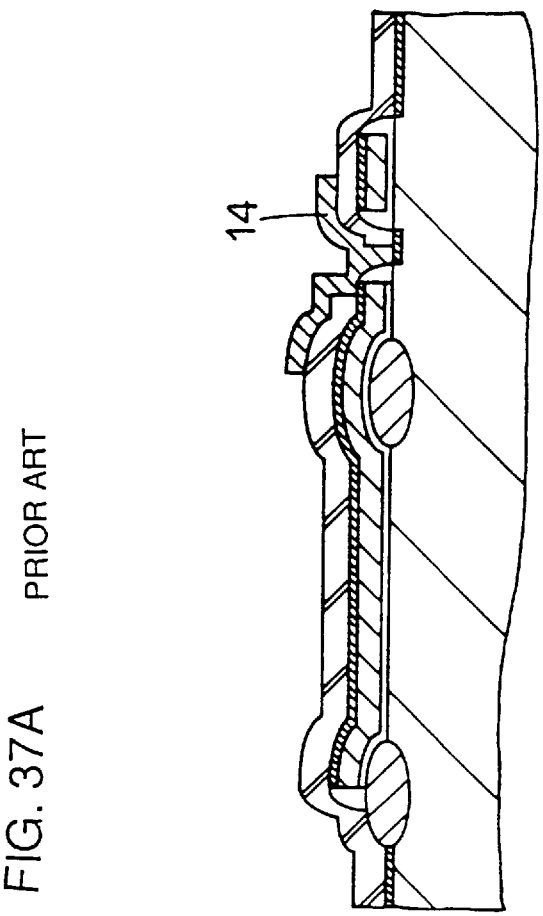
FIGS. 37A and 37B are sectional views and plan views showing the semiconductor device in an eighth step of the method of fabricating the conventional semiconductor device respectively.
Figure 37B:
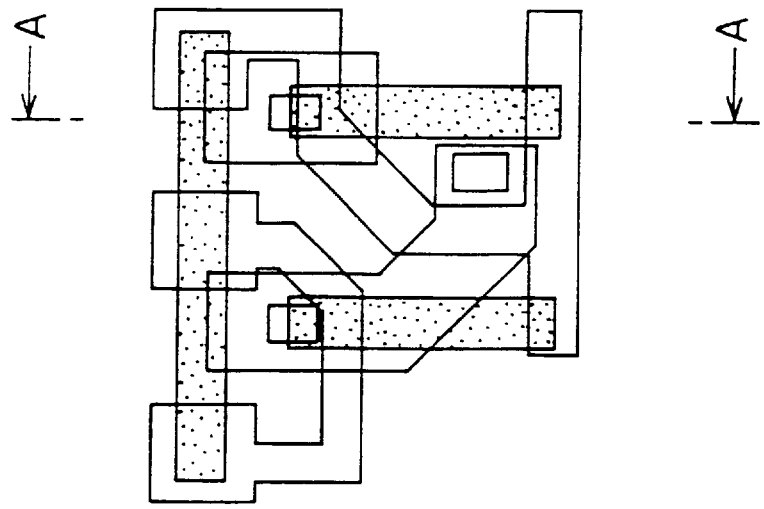
Figure 39B:
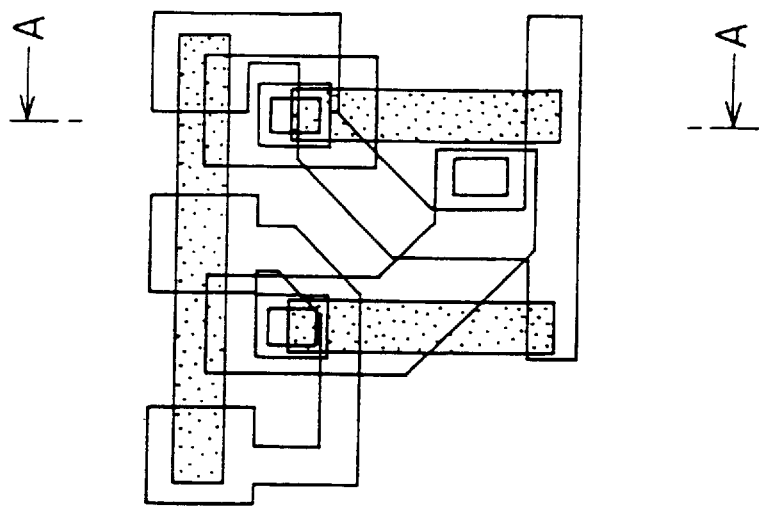
FIGS. 39A and 39B are sectional views and plan views showing the semiconductor device in a tenth step of the method of fabricating the conventional semiconductor device respectively.
Figure 39A:
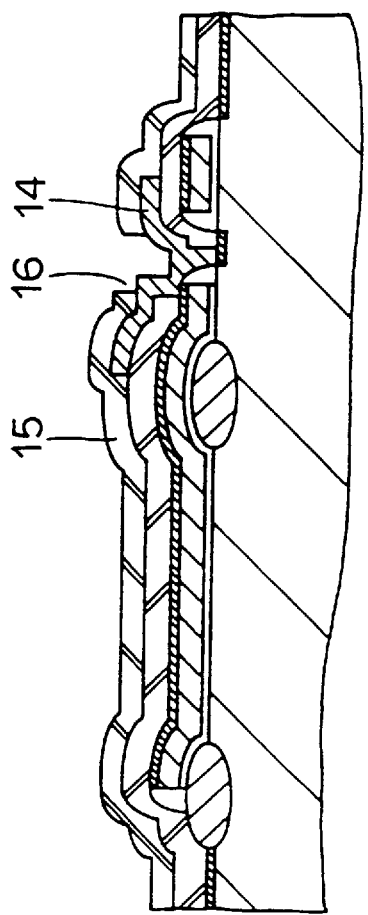
Figure 40B:
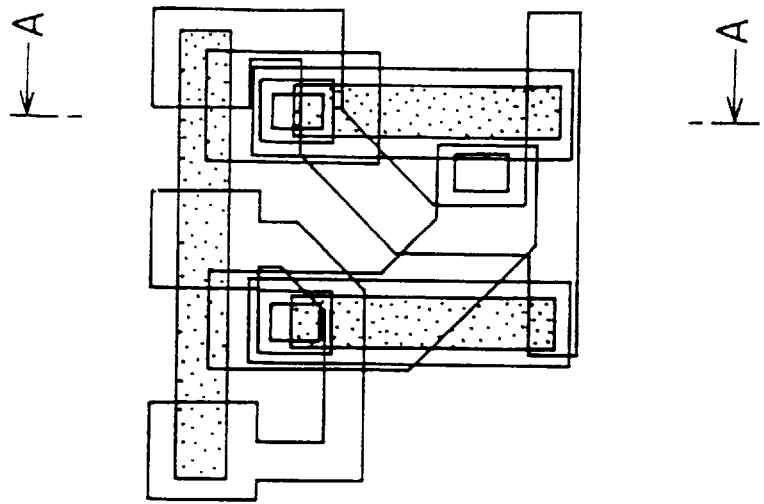
FIGS. 40A and 40B are sectional views and plan views showing the semiconductor device in an eleventh step of the method of fabricating the conventional semiconductor device respectively.
Figure 40A:
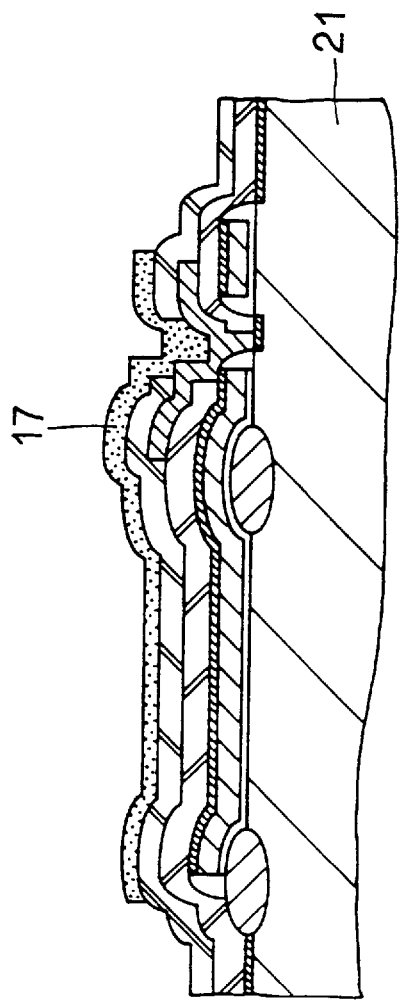
Figure 41B:
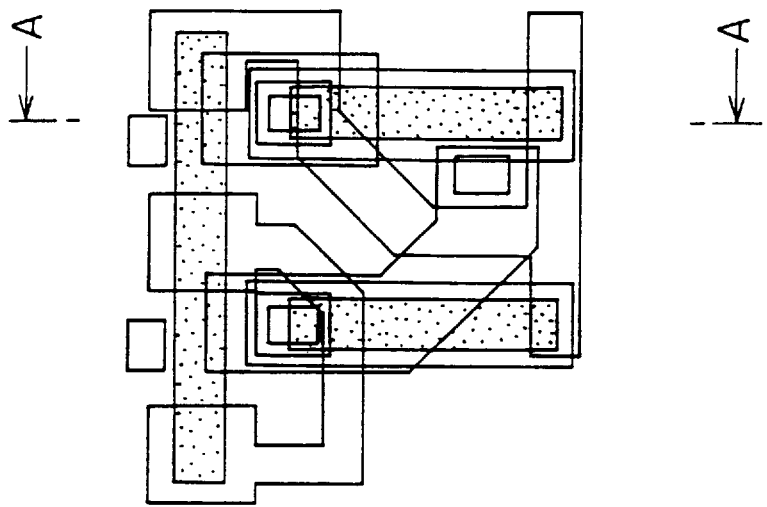
FIGS. 41A and 41B are sectional views and plan views showing the semiconductor device in a twelfth step of the method of fabricating the conventional semiconductor device respectively.
Figure 41A:
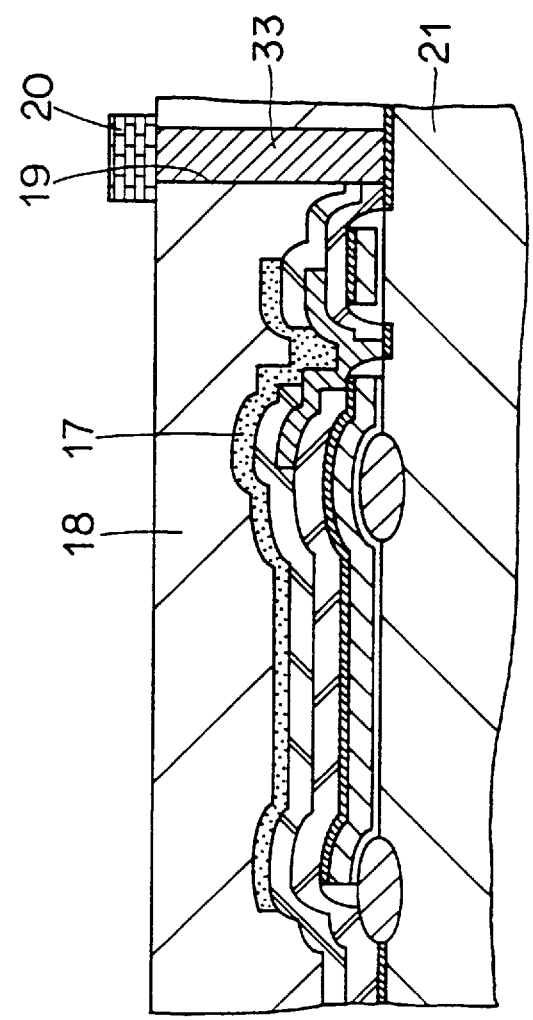

Referring to FIGS. 27A and 27B, a thick interlayer insulating film 18 is formed on the silicon substrate 21, to cover the polysilicon layer 17. A contact hole 32 is formed in the interlayer insulating film 18, for receiving a tungsten plug 33. The tungsten plug 33 is embedded in the contact hole 32, and connected with an aluminum wire.

In the semiconductor device according to the first aspect of the present invention, as hereinabove described, the internal wiring layer is formed by the titanium layer and the silicide layer which is provided on the titanium layer, whereby the semiconductor device has an internal wire of low resistance.

In the semiconductor device according to the second aspect of the present invention, the internal wiring layer is formed by the titanium layer and the silicide layer which is provided on the titanium layer, whereby the static random access memory-has an internal wire of low resistance.

In the method of fabricating a semiconductor device according to the third aspect of the present invention, the internal wiring layer is formed by the titanium layer and the silicide layer which is provided on the titanium layer, whereby a semiconductor device having an internal wire of low resistance is provided. Further, the internal wiring layer is formed by sputtering, whereby the silicide layer which is formed on the conductive layer is not broken.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A method of fabricating a semiconductor device having an internal wire, comprising:

a first step of forming a conductive layer in a surface of a semiconductor substrate;

a second step of forming a conductor on said semiconductor substrate in proximity to said conductive layer;

a third step of forming a first silicide layer on the surface of said conductive layer and forming a second silicide layer on the surface of said conductor;

a fourth step of forming an interlayer insulating film covering said conductor and said conductive layer;

a fifth step of forming a contact hole in said interlayer insulating film for exposing both the surface of said first silicide layer and a surface of an end of said second silicide layer;

a sixth step of forming a titanium film for covering a side wall surface and a bottom surface of said contact hole by sputtering, to be in contact with both said surface of said first silicide layer and said end of said second silicide layer;

a seventh step of forming a third silicide layer on said titanium film by sputtering; and an eighth step of patterning said third silicide layer and said titanium film in the form of said internal wire.

2. A method of fabricating a semiconductor device having an internal wire in accordance with claim 1, wherein said contact hole is formed to bore through said surface of said semiconductor substrate.

3. A method of fabricating a semiconductor device having an internal wire in accordance with claim 2, further comprising a step of forming a new silicide layer on said silicide film after formation of said suicide film in advance of said patterning.

* * * * *